US009955583B2

United States Patent
Ishii et al.

(10) Patent No.: US 9,955,583 B2
(45) Date of Patent: *Apr. 24, 2018

(54) SURFACE-TREATED COPPER FOIL, COPPER FOIL WITH CARRIER, SUBSTRATE, RESIN SUBSTRATE, PRINTED WIRING BOARD, COPPER CLAD LAMINATE AND METHOD FOR PRODUCING PRINTED WIRING BOARD

(71) Applicant: JX NIPPON MINING & METALS CORPORATION, Tokyo (JP)

(72) Inventors: Masafumi Ishii, Ibaraki (JP); Misato Honda, Ibaraki (JP); Nobuaki Miyamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 110 days.

This patent is subject to a terminal disclaimer.

(21) Appl. No.: 14/907,478

(22) PCT Filed: Jul. 23, 2014

(86) PCT No.: PCT/JP2014/069489
§ 371 (c)(1),
(2) Date: Jan. 25, 2016

(87) PCT Pub. No.: WO2015/012327
PCT Pub. Date: Jan. 29, 2015

(65) Prior Publication Data
US 2016/0183380 A1    Jun. 23, 2016

(30) Foreign Application Priority Data

Jul. 23, 2013  (JP) ................................. 2013-153010
Jul. 23, 2013  (JP) ................................. 2013-153014

(Continued)

(51) Int. Cl.
B21C 37/00    (2006.01)
H05K 3/02     (2006.01)
(Continued)

(52) U.S. Cl.
CPC ............... *H05K 3/025* (2013.01); *B32B 3/26* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS 6,541,126 B1    4/2003  Yoshioka et al.
7,381,475 B2    6/2008  Suzuki
(Continued)

FOREIGN PATENT DOCUMENTS

CN    1657279 A      8/2005
JP    01-194391 A    8/1989
(Continued)

OTHER PUBLICATIONS

PCT/JP2014/069489, English translation of the Written Opinion of the International Searching Authority (dated Oct. 14, 2014).
(Continued)

*Primary Examiner* — Seth Dumbris
(74) *Attorney, Agent, or Firm* — Drinker Biddle & Reath LLP

(57) ABSTRACT

The present invention provides a surface-treated copper foil capable of imparting the profile shape of the substrate surface after removal of the copper foil, the profile shape maintaining fine wiring formability and achieving satisfactory adhesion of electroless copper plating coating. The present invention also provides a resin substrate provided (Continued)

with a profile shape of the surface maintaining fine wiring formability and achieving satisfactory adhesion of electroless copper plating coating. The surface-treated copper foil of the present invention is a surface-treated copper foil having a surface-treated layer formed on a copper foil, and the surface roughness Sz of the surface of the surface-treated layer is 2 to 6 μm.

11 Claims, 4 Drawing Sheets

(30) Foreign Application Priority Data

Aug. 1, 2013 (JP) .................... 2013-160827
Aug. 1, 2013 (JP) .................... 2013-160828

(51) Int. Cl.
| | | |
|---|---|---|
| *B32B 15/08* | (2006.01) | |
| *B32B 15/20* | (2006.01) | |
| *B32B 3/26* | (2006.01) | |
| *C25D 7/06* | (2006.01) | |
| *H05K 3/20* | (2006.01) | |
| *H05K 3/38* | (2006.01) | |
| *C23C 18/16* | (2006.01) | |
| *H05K 1/09* | (2006.01) | |
| *H05K 3/42* | (2006.01) | |
| *C25D 1/04* | (2006.01) | |
| *C25D 3/38* | (2006.01) | |
| *C25D 3/56* | (2006.01) | |
| *C25D 3/58* | (2006.01) | |
| *C25D 5/02* | (2006.01) | |
| *C25D 5/10* | (2006.01) | |
| *C25D 5/18* | (2006.01) | |
| *C25D 5/34* | (2006.01) | |
| *C25D 5/48* | (2006.01) | |
| *C23C 18/40* | (2006.01) | |

(52) U.S. Cl.
CPC ............ *C25D 7/0614* (2013.01); *H05K 3/205* (2013.01); *H05K 3/384* (2013.01); *H05K 3/389* (2013.01); *B32B 2457/08* (2013.01); *C23C 18/1653* (2013.01); *C23C 18/405* (2013.01); *C25D 1/04* (2013.01); *C25D 3/38* (2013.01); *C25D 3/562* (2013.01); *C25D 3/58* (2013.01); *C25D 5/022* (2013.01); *C25D 5/10* (2013.01); *C25D 5/18* (2013.01); *C25D 5/34* (2013.01); *C25D 5/48* (2013.01); *C25D 7/0671* (2013.01); *H05K 1/09* (2013.01); *H05K 3/388* (2013.01); *H05K 3/427* (2013.01); *H05K 2201/0355* (2013.01); *H05K 2203/0307* (2013.01); *H05K 2203/072* (2013.01); *H05K 2203/0726* (2013.01); *H05K 2203/1152* (2013.01)

(56) References Cited

U.S. PATENT DOCUMENTS

| | | | |
|---|---|---|---|
| 9,724,896 B2* | 8/2017 | Momoi | B32B 15/20 |
| 2003/0062716 A1* | 4/2003 | Curiel | G06K 19/077 |
| | | | 283/71 |
| 2008/0280159 A1 | 11/2008 | Iwakiri et al. | |
| 2009/0183901 A1 | 7/2009 | Kataoka et al. | |
| 2011/0209903 A1 | 9/2011 | Uno et al. | |
| 2012/0125667 A1 | 5/2012 | Jung et al. | |
| 2012/0216947 A1* | 8/2012 | Huber | B30B 3/005 |
| | | | 156/219 |
| 2013/0040162 A1* | 2/2013 | Fujisawa | B32B 15/01 |
| | | | 428/607 |
| 2013/0220685 A1 | 8/2013 | Kohiki et al. | |
| 2015/0224742 A1* | 8/2015 | Inoue | B29C 45/14311 |
| | | | 428/687 |

FOREIGN PATENT DOCUMENTS

| | | |
|---|---|---|
| JP | 2006196863 A | 7/2006 |
| JP | 2008285751 A | 11/2008 |
| JP | 2009105286 A | 5/2009 |
| JP | 2011040727 A | 2/2011 |
| JP | 2011040728 A | 2/2011 |
| JP | 2011074405 A | 4/2011 |
| JP | 2012109526 A | 6/2012 |
| JP | 2012144021 A | 8/2012 |
| JP | 5204908 B1 | 6/2013 |
| JP | 5963824 B2 | 8/2016 |
| TW | 1244358 B | 11/2005 |
| WO | WO-2010093009 A1 | 8/2010 |
| WO | WO-2012043182 A1 | 4/2012 |

OTHER PUBLICATIONS

Extended Supplementary EP Search Report for EP Application No. 14829592.6 dated Mar. 10, 2017.

* cited by examiner

SURFACE-TREATED COPPER FOIL, COPPER FOIL WITH CARRIER, SUBSTRATE, RESIN SUBSTRATE, PRINTED WIRING BOARD, COPPER CLAD LAMINATE AND METHOD FOR PRODUCING PRINTED WIRING BOARD

TECHNICAL FIELD

The present invention relates to a surface-treated copper foil, a copper foil with carrier, a substrate, a resin substrate, a printed wiring board, a copper clad laminate and a method for producing a printed wiring board.

As the method for forming circuits of a semiconductor package substrate and a printed wiring board, a subtractive method is predominantly used. However, recently, due to high integration of semiconductors, miniaturization has been advanced in the circuits of semiconductor package substrates and printed wiring boards used for highly integrated semiconductors, and accordingly it has been becoming difficult to form fine circuits on the basis of subtractive methods.

As measures for forming further finer wirings, the following methods have been attracting attention: a circuit forming method (1) in which pattern copper plating is performed by using an ultra-thin copper foil as a power feeding layer, and finally the ultra-thin copper layer is removed by flash etching to form wirings; a circuit forming method (2) in which a prepreg or a build-up film is cured by vacuum pressing or the like, the surface of the cured material is roughened to form appropriate asperities on the surface of a substrate, and thus reliable fine wirings are formed on the substrate surface; and a circuit forming method (3) in which a surface profile of a copper foil is transferred to the surface of a substrate to form appropriate asperities on the substrate surface, and thus reliable fine airings are formed on the substrate surface. These methods are each generally referred to as a SAP (semi-additive process).

A SAP using the surface profile of a copper foil is described in, for example, Patent Literature 1. Examples of a typical SAP using such a surface profile of a copper foil includes the following. Specifically, here is quoted a method in which a copper foil laminated on a resin is subjected to an entire-surface etching, the etched surface of a substrate is subjected to hole opening, the hole-opening portions and the entire surface or part of the surface of the substrate are subjected to desmear treatment, a dry film is bonded to the etched surface of the hole opening portions, the dry film on the portions in which no circuit is formed is exposed and developed, the unnecessary portion of the dry film is removed with a chemical solution, electroless copper plating and electric copper plating are applied to the etched substrate surface having no coating dry film and having the copper foil surface profile transferred thereto, and finally the electroless copper plating layer is removed by flash etching to form fine wirings.

CITATION LIST

Patent Literature

Japanese Patent Laid-Open No. 2006-196863

SUMMARY OF INVENTION

Technical Problem

For forming fine wirings, it is preferable that the profile of the substrate surface be small and smooth; however, in such a case, the adhesion of the electroless copper plating coating is weak, and the reliability demanded for semiconductor package substrates or printed wiring boards is liable to be impaired. On the other hand, in order to ensure the adhesion of the electroless copper plating coating, it is preferable that the profile of the substrate surface be large; however, in such a case, fine wiring formability is liable to be impaired.

With these respects, the conventional technology has not yet performed sufficient investigation, to leave room for improvement. Accordingly, the present invention takes it as its object to provide a surface-treated copper foil capable of imparting the profile shape of the substrate surface after removal of the copper foil, the profile shape maintaining fine wiring formability and achieving satisfactory adhesion of electroless copper plating coating, and/or a resin substrate provided with such a profile shape of the surface thereof.

Solution to Problem

In order to achieve the above-described object, the present inventors continuously made a diligent study, and have consequently discovered that a surface-treated copper foil in which the surface roughness (the maximum height of the surface) Sz of the surface of a surface-treated layer is controlled so as to fall within a predetermined range is used, the surface-treated copper foil concerned is bonded to a substrate on which circuits are to be formed, then the surface-treated copper foil is removed, and thus, it is possible to provide a profile shape of the substrate surface after removal of the copper foil, the profile shape maintaining the fine wiring formability and achieving satisfactory adhesion of electroless copper plating coating. In addition, the present inventors have discovered that by using a resin substrate in which the surface roughness (the maximum height of the surface) Sz of the surface is controlled so as to fall within a predetermined range, the fine wiring formability can be maintained and the satisfactory adhesion of the electroless copper plating coating can be achieved, during forming circuits on the resin substrate surface.

The present invention has been perfected on the basis of the above-described discovery, and an aspect of the present invention is a surface-treated copper foil, wherein a surface treated layer is formed on a copper foil, and the surface roughness Sz of the surface of the surface-treated layer is 2 to 6 µm.

In an embodiment, the surface-treated copper foil of the present invention is a surface-treated copper foil, wherein a surface-treated layer is formed on a copper foil, and the ratio B/A of the three-dimensional surface area B to the two-dimensional surface area A of the surface of the surface-treated layer is 1.05 to 1.8.

In another embodiment, in the surface-treated copper foil of the present invention, when the surface-treated copper foil is bonded, via the surface-treated layer side thereof, to a resin substrate and the surface-treated copper foil is removed, the surface roughness Sz of the surface, on the copper foil removal side, of the resin substrate is 1 to 5 µm.

In yet another embodiment, in the surface-treated copper foil of the present invention, when the surface-treated copper foil is bonded, via the surface-treated layer side thereof, to a resin substrate and the surface-treated copper foil is removed, the ratio B/A of the three-dimensional surface area B to the two-dimensional surface area A of the surface, on the copper foil removal side, of the resin substrate is 1.01 to 1.5.

In yet another embodiment, in the surface-treated copper foil of the present invention, when the surface-treated copper foil is bonded, via the surface-treated layer side thereof, to a resin substrate and the surface-treated copper foil is removed, the black area rate of the surface, on the copper foil removal side, of the resin substrate is 10 to 50%, and the average value of the diameters of the holes of the surface, on the copper foil removal side, of the resin substrate is 0.03 to 1.0 µm.

In another embodiment, the surface-treated copper foil of the present invention is a surface-treated copper foil having a surface-treated layer formed on a copper foil, wherein the ratio B/A of the three-dimensional surface area B to the two-dimensional surface area A of the surface of the surface-treated layer is 1.05 to 1.8.

In yet another embodiment, in the surface-treated copper foil of the present invention, when the surface-treated copper foil is bonded, via the surface-treated layer side thereof, to a resin substrate and the surface-treated copper foil is removed, the surface roughness Sz of the surface, on the copper foil removal side, of the resin substrate is 1 to 5 µm.

In yet another embodiment, in the surface-treated copper foil of the present invention, when the surface-treated copper foil is bonded, via the surface-treated layer side thereof, to a resin substrate and the surface-treated copper foil is removed, the ratio B/A of the three-dimensional surface area B to the two-dimensional surface area A of the surface, on the copper foil removal side, of the resin substrate is 1.01 to 1.5.

In yet another embodiment, in the surface-treated copper foil of the present invention, when the surface-treated copper foil is bonded, via the surface-treated layer side thereof, to the resin substrate and the surface-treated copper foil is removed, the black area rate of the surface, on the copper foil removal side, of the resin substrate is 10 to 50%, and the average value of the diameters of the holes of the surface, on the copper foil removal side, of the resin substrate is 0.03 to 1.0 µm.

In yet another aspect, the surface-treated copper foil of the present invention is a surface-treated copper foil, wherein when the surface-treated copper foil is bonded, via the surface-treated layer side thereof, to a resin substrate and the surface-treated copper foil is removed, the surface roughness Sz of the surface, on the copper foil removal side, of the resin substrate is 1 to 5 µm.

In yet another embodiment, in the surface-treated copper foil of the present invention, when the surface-treated copper foil is bonded, via the surface-treated layer side thereof, to a resin substrate and the surface-treated copper foil is removed, the ratio B/A of the three-dimensional surface area B to the two-dimensional surface area A of the surface, on the copper foil removal side, of the resin substrate is 1.01 to 1.5.

In yet another embodiment, in the surface-treated copper foil of the present invention, when the surface-treated copper foil is bonded, via the surface-treated layer side thereof, to a resin substrate and the surface-treated copper foil is removed, the black area rate of the surface, on the copper foil removal side, of the resin substrate is 10 to 50%, and the average value of the diameters of the holes of the surface, on the copper foil removal side, of the resin substrate is 0.03 to 1.0 µm.

In yet another aspect, the present invention is a surface-treated copper foil, wherein when the surface-treated copper foil is bonded, via the surface-treated layer side thereof, to a resin substrate and the surface-treated copper foil is removed, the ratio B/A of the three-dimensional surface area B to the two-dimensional surface area A of the surface, on the copper foil removal side, of the resin substrate is 1.01 to 1.5.

In yet another embodiment in the present invention, when the surface-treated copper foil is bonded, via the surface-treated layer side thereof, to a resin substrate and the surface-treated copper foil is removed, the black area rate of the surface, on the copper foil removal side, of the resin substrate is 10 to 50%, and the average value of the diameters of the holes of the surface, on the copper foil removal side, of the resin substrate is 0.03 to 1.0 µm.

In yet another aspect, the present invention is a surface-treated copper foil, wherein when the surface-treated copper foil is bonded, via the surface-treated layer side thereof, to a resin substrate and the surface-treated copper foil is removed, the black area rate of the surface, on the copper foil removal side, of the resin substrate is 10 to 50%, and the average value of the diameters of the holes of the surface, on the copper foil removal side, of the resin substrate is 0.03 to 1.0 µm.

In yet another embodiment, in the surface-treated copper foil of the present invention, the surface-treated layer is a roughening-treated layer.

In yet another embodiment, in the surface-treated copper foil of the present invention, the roughening-treated layer is a layer composed of a single substance selected from or an alloy including one or more selected from the group consisting of copper, nickel, cobalt, phosphorus, tungsten, arsenic, molybdenum, chromium and zinc.

In yet another embodiment, the surface-treated copper foil of the present invention has, on the surface of the roughening-treated layer, one or more layers selected from the group consisting of a heat resistant layer, a rust-preventing layer, a chromate-treated layer and a silane coupling treated layer.

In a yet another embodiment, in the surface-treated copper foil of the present invention, the surface-treated layer is one or more layers selected from the group consisting of a roughening-treated layer, a heat resistant layer, a rust-preventing layer, a chromate-treated layer and a silane coupling treated layer.

In a yet another embodiment, the surface-treated copper foil of the present invention is provided with a resin layer on the surface-treated layer.

In yet another aspect, the present invention is a copper foil with carrier, including a carrier, an intermediate layer and an ultra-thin copper layer in this order, wherein the ultra-thin copper layer is the surface-treated copper foil of the present invention.

In an embodiment, the copper foil with carrier of the present invention includes the ultra-thin copper layer on each of both surfaces of the carrier.

In another embodiment, the copper foil with carrier of the present invention includes a roughening-treated layer on the side opposite to the ultra-thin copper layer of the carrier.

In yet another aspect, the present invention is a substrate prepared by bonding the surface-treated copper foil of the present invention, via the surface-treated layer side thereof, to a substrate, and by removing the surface-treated copper foil, wherein the surface roughness Sz of the surface, on the copper foil removal side, of the substrate is 1 to 5 µm.

In yet another aspect, the present invention is a substrate prepared by bonding the copper foil with carrier of the present invention, via the ultra-thin copper layer side thereof, to a substrate, by removing the carrier from the copper foil with carrier, and by then removing the ultra-thin copper layer, being the surface-treated copper foil, wherein the surface roughness Sz of the surface, on the copper foil removal side, of the substrate is 1 to 5 µm.

In yet another aspect, the present invention is a substrate prepared by bonding the surface-treated copper foil of the present invention, via the surface-treated layer side thereof, to a substrate, and by removing the surface-treated copper foil, wherein the ratio B/A of the three-dimensional surface area B to the two-dimensional surface area A of surface, on the copper foil removal side, of the substrate is 1.01 to 1.5.

In yet another aspect, the present invention is a substrate prepared by bonding the copper foil with carrier of the present invention, via the ultra-thin copper layer side thereof, to a substrate, by removing the carrier from the copper foil with carrier, and by then removing the ultra-thin copper layer, being the surface-treated copper foil, wherein the ratio B/A of the three-dimensional surface area B to the two-dimensional surface area A of surface, on the copper foil removal side, of the substrate is 1.01 to 1.5.

In yet another aspect, the present invention is a substrate prepared by bonding the surface-treated copper foil of the present invention, via the surface-treated layer side thereof, to a substrate, and by removing the surface-treated copper foil, wherein the black area rate of the surface, on the copper foil removal side, of the substrate is 10 to 50%, and the average value of the diameters of the holes of the surface, on the copper foil removal side, of the substrate is 0.03 to 1.0 µm.

In yet another aspect, the present invention is a substrate prepared by bonding the copper foil with carrier of the present invention, via the ultra-thin copper layer side thereof, to a substrate, by removing the carrier from the copper foil with carrier, and by then removing the ultra-thin copper layer, being the surface-treated copper foil, wherein the black area rate of the surface, on the copper foil removal side, of the substrate is 10 to 50%, and the average value of the diameters of the holes of the surface, on the copper foil removal side, of the substrate is 0.03 to 1.0 µm.

In yet another aspect, the present invention is a copper clad laminate produced by using the surface-treated copper foil of the present invention, or the copper foil with carrier of the present invention.

In yet another aspect, the present invention is a printed wiring board produced by using the surface-treated copper foil of the present invention, or the copper foil with carrier of the present invention.

In yet another aspect, the present invention is an electronic device using the printed wiring board of the present invention.

In yet another aspect, the present invention is a method for producing a printed wiring board, including:

a step of preparing the surface-treated copper foil of the present invention and an insulating substrate;

a step of laminating the surface-treated copper foil, via the surface-treated layer side thereof, on the insulating substrate;

a step of removing the surface-treated copper foil on the insulating substrate; and a step of forming a circuit on the surface of the insulating substrate with the surface-treated copper foil removed therefrom.

In yet another aspect, the present invention is a method for producing a printed wiring board, including:

a step of preparing the copper foil with carrier of the present invention and an insulating substrate;

a step of laminating the copper foil with carrier, via the ultra-thin copper layer side thereof, on the insulating substrate;

a step of peeling the carrier of the copper foil with carrier after laminating the copper foil with carrier and the insulating substrate on each other;

a step of removing the ultra-thin copper layer on the insulating substrate after peeling the carrier; and a step of forming a circuit on the surface of the insulating substrate with the ultra-thin copper layer removed therefrom.

In yet another aspect, the present invention is a method for producing a printed wiring board, including:

a step of preparing the surface-treated copper foil of the present invention and an insulating substrate;

a step of forming a copper clad laminate by laminating the surface-treated copper foil, via the surface-treated layer side thereof, on the insulating substrate; and a step of subsequently forming a circuit by a semi-additive method, a subtractive method, a partly additive method or a modified semi-additive method.

In yet another aspect, the present invention is a method for producing a printed wiring board, including:

a step of preparing the copper foil with carrier of the present invention and an insulating substrate;

a step of laminating the copper foil with carrier, via the ultra-thin copper layer side thereof, on the insulating substrate;

a step of forming a copper clad laminate by passing through a step of peeling the carrier of the copper foil with carrier after laminating the copper foil with carrier and the insulating substrate on each other; and a step of subsequently forming a circuit by a semi-additive method, a subtractive method, a partly additive method or a modified semi-additive method.

In yet another aspect, the present invention is a method for producing a printed wiring board, including:

a step of preparing the surface-treated copper foil of the present invention, with a circuit formed on the surface thereof on the surface-treated layer formed side, or the copper foil with carrier of the present invention, with a circuit formed on the surface thereof on the ultra-thin copper layer side;

a step of forming a resin layer on the surface of the surface-treated copper foil or the surface of the copper foil with carrier so as for the circuit to be embedded;

a step of forming a circuit on the surface of the resin layer; and a step of exposing the circuit embedded in the resin layer by removing the surface-treated copper foil or the copper foil with carrier.

In yet another aspect, the present invention is a method for producing a printed wiring board, including:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, the surface of the surface-treated copper foil, the surface of the metal foil with carrier, or the surface of the copper foil with carrier so as for the circuit to be embedded;

a step of laminating a second surface-treated copper foil being the surface-treated copper foil of the present invention, via the surface-treated layer side thereof, on the resin layer, or a step of laminating a second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of removing the surface-treated copper foil on the resin layer, or the ultra-thin copper layer remaining after peeling the carrier of the second copper foil with carrier;

a step of forming a circuit on the surface of the resin layer with the surface-treated copper foil removed therefrom, or on the surface of the resin layer with the ultra-thin copper layer removed therefrom; and a step of exposing the circuit embedded in the resin layer after forming the circuit on the resin layer, by removing the metal foil or the first surface-treated copper foil, or by removing the ultra-thin metal layer after peeling the carrier of the metal foil with carrier, or by removing the ultra-thin copper layer after peeling the carrier of the first copper foil with carrier.

In yet another aspect, the present invention is a method for producing a printed wiring board, including:

a step of preparing the surface-treated copper foil of the present invention with a circuit formed on the surface thereof on the surface-treated layer formed side, or the copper foil with carrier of the present invention with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, or a step of laminating a metal foil with carrier, via the ultra-thin copper layer side thereof, on the resin layer;

a step of peeling the carrier of the metal foil with carrier, in the case where the foil laminated on the resin layer is the metal foil with carrier;

a step of removing the metal foil on the resin layer, or the ultra-thin metal layer remaining after peeling the carrier of the metal foil with carrier;

a step of forming a circuit on the surface of the resin layer with the metal foil removed therefrom, or the surface of the resin layer with the ultra-thin copper layer removed therefrom; and a step of exposing the circuit embedded in the resin layer circuit after forming the circuit on the resin layer, by removing the surface-treated copper foil, or by removing the ultra-thin copper layer after peeling the carrier of the copper foil with carrier.

In yet another aspect, the present invention is a method for producing a printed wiring board, including:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, or the surface of the surface-treated copper foil, or the surface of the metal foil with carrier, or the surface of the copper foil with carrier so as for the circuit to be embedded;

a step of laminating a second surface-treated copper foil being the surface-treated copper foil of the present invention, via the surface-treated layer side thereof, on the resin layer, or a step of laminating a second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of forming a circuit on the resin layer, by using the surface-treated copper foil on the resin layer, or the ultra-thin copper layer remaining after peeling the carrier of the second copper foil with carrier, by a semi-additive method, a subtractive method, a partly additive method or a modified semi-additive method; and a step of exposing the circuit embedded in the resin layer after forming the circuit on the resin layer, by removing the metal foil or by removing the first surface-treated copper foil, or by removing the ultra-thin metal layer after peeling the carrier of the metal foil with carrier, or by removing the ultra-thin copper layer after peeling the carrier of the first copper foil with carrier.

In yet another aspect, the present invention is a method for producing a printed wiring board, including:

a step of preparing the surface-treated copper foil of the present invention with a circuit formed on the surface thereof on the surface-treated layer formed side, or the copper foil with carrier of the present invention with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, or a step of laminating a metal foil with carrier, via the ultra-thin copper layer side thereof, on the resin layer;

a step of peeling the carrier of the metal foil with carrier, in the case where the foil laminated on the resin layer is the metal foil with carrier;

a step of forming a circuit on the resin layer by using the metal foil on the resin layer, or the ultra-thin metal layer remaining after peeling the carrier of the metal foil with carrier, by a semi-additive method, a subtractive method, a partly additive method or a modified semi-additive method; and a step of exposing the circuit embedded in the resin layer after forming the circuit on the resin layer, by removing the surface-treated copper foil, or by removing the ultra-thin copper layer after peeling the carrier of the copper foil with carrier.

In yet another aspect, the present invention is a resin substrate of the present invention having a surface roughness Sz of 1 to 5 μm.

In an embodiment, in the resin substrate of the present invention, the ratio B/A of the three-dimensional surface area B to the two-dimensional surface area A of the surface is 1.01 to 1.5.

In another embodiment, in the resin substrate of the present invention, the black area rate of the surface is 10 to 50%, and the average value of the diameters of the holes of the surface is 0.03 to 1.0 μm.

In yet another aspect, the present invention is a resin substrate having the ratio B/A of the three-dimensional surface area B to the two-dimensional surface area A of the surface of 1.01 to 1.5.

In yet another aspect, the present invention is a resin substrate having the black area rate of the surface of 10 to 50%, and the average value of the diameters of the holes of the surface of 0.03 to 1.0 μm.

In yet another embodiment, the resin substrate of present invention has the black area rate of the surface of 10 to 50%, and the average value of the diameters of the holes of the surface of 0.03 to 1.0 μm.

In yet another embodiment, the resin substrate of present invention is for use in the semi-additive method.

In yet another aspect, the present invention is a printed wiring board produced by using the resin substrate of the present invention.

In yet another aspect, the present invention is a copper clad laminate produced by using the resin substrate of the present invention.

In yet another aspect, the present invention is a method for producing a printed wiring board, including:
a step of preparing a surface-treated copper foil and a resin substrate;
a step of laminating the surface-treated copper foil, via the surface-treated layer side thereof, on the resin substrate;
a step of obtaining the resin substrate of the present invention by removing the surface-treated copper foil on the resin substrate; and
a step of forming a circuit on the surface of the resin substrate with the surface-treated copper foil removed therefrom.

In yet another aspect, the present invention is a method for producing a printed wiring board, including:
a step of preparing a copper foil with carrier constituted by laminating a carrier, an intermediate layer and an ultra-thin copper layer in this order, and a resin substrate;
a step of laminating the copper foil with carrier, via the ultra-thin copper layer side thereof, on the resin substrate; a step of peeling the carrier of the copper foil with carrier after laminating the copper foil with carrier and the resin substrate on each other;
a step of obtaining the resin substrate of the present invention by removing the ultra-thin copper layer on the resin substrate after peeling the carrier; and
a step of forming a circuit on the surface of the resin substrate with the ultra-thin copper layer removed therefrom.

In yet another aspect, the present invention is a method for producing a printed wiring board, including: a step of forming a circuit, after forming a copper clad laminate by laminating a surface-treated copper foil via the surface-treated layer side thereof, on the resin substrate of the present invention, by a semi-additive method, a subtractive method, a partly additive method or a modified semi-additive method.

In yet another aspect, the present invention is a method for producing a printed wiring board, including:
a step of laminating a copper foil with carrier constituted by laminating a carrier, an intermediate layer and an ultra-thin copper layer in this order, via the ultra-thin copper layer side thereof, on the resin substrate of the present invention;
a step of forming a copper clad laminate by passing through a step of peeling the carrier of the copper foil with carrier after laminating the copper foil with carrier and the resin substrate on each other; and
a step of subsequently forming a circuit by a semi-additive method, a subtractive method, a partly additive method or a modified semi-additive method.

In yet another aspect, the present invention is a method for producing a printed wiring board, including:

a step of preparing a metal foil with a circuit formed on the surface thereof;
a step of forming a resin substrate on the surface of the metal foil so as for the circuit to be embedded;
a step of laminating a surface-treated copper foil, via the surface-treated layer side thereof, on the resin substrate;
a step of obtaining the resin substrate of the present invention by removing the surface-treated copper foil on the resin substrate;
a step of forming a circuit on the surface of the resin substrate with the surface-treated copper foil removed therefrom; and
a step of exposing the circuit formed on the surface of the metal foil and embedded in the resin substrate by removing the metal foil.

In yet another aspect, the present invention is a method for producing a printed wiring board, including:
a step of forming a circuit on the surface on the ultra-thin copper layer side of a first copper foil with carrier constituted by laminating a carrier, an intermediate layer and an ultra-thin copper layer in this order;
a step of forming a resin substrate on the surface on the ultra-thin copper layer side of the first copper foil with carrier so as for the circuit to be embedded;
a step of preparing a second copper foil with carrier constituted by laminating a carrier, an intermediate layer and an ultra-thin copper layer in this order, and laminating the second copper foil with carrier, via the ultra-thin copper layer side thereof, on the resin substrate;
a step of peeling the carrier of the second copper foil with carrier after laminating the second copper foil with carrier on the resin substrate;
a step of obtaining the resin substrate of the present invention by removing the ultra-thin copper layer on the resin substrate after peeling the carrier of the second copper foil with carrier;
a step of forming a circuit on the surface of the resin substrate with the ultra-thin copper layer removed therefrom;
a step of peeling the carrier of the first copper foil with carrier after forming the circuit on the resin substrate; and
a step of exposing the circuit formed on the surface on the ultra-thin copper layer side of the first copper foil with carrier and embedded in the resin substrate, by removing the ultra-thin copper layer of the first copper foil with carrier after peeling the carrier of the first copper foil with carrier.

In yet another aspect, the present invention is a method for producing a printed wiring board, including:
a step of preparing a metal foil with a circuit formed on the surface thereof;
a step of forming the resin substrate of the present invention on the surface of the metal foil so as for the circuit to be embedded;
a step of laminating a surface-treated copper foil, via the surface-treated layer side thereof, on the resin substrate, and forming a circuit on the resin layer by a semi-additive method, a subtractive method, a partly additive method or a modified semi-additive method; and
a step of exposing the circuit formed on the surface of the metal foil and embedded in the resin substrate by removing the metal foil.

In yet another aspect, the present invention is a method for producing a printed wiring board, including:
a step of forming a circuit on the surface on the ultra-thin copper layer side of a first copper foil with carrier constituted by laminating a carrier, an intermediate layer and an ultra-thin copper layer in this order;

a step of forming the resin substrate of the present invention on the surface on the ultra-thin copper layer side of the first copper foil with carrier so as for the circuit to be embedded;

a step of preparing a second copper foil with carrier constituted by laminating a carrier, an intermediate layer and an ultra-thin copper layer in this order; laminating the second copper foil with carrier, via the ultra-thin copper layer side thereof, on the resin substrate and then peeling the carrier of the second copper foil with carrier; and forming a circuit on the resin substrate by a semi-additive method, a subtractive method, a partly additive method or a modified semi-additive method;

a step of peeling the carrier of the first copper foil with carrier after forming a circuit on the resin substrate; and a step of exposing the circuit formed on the surface on the ultra-thin copper layer side of the first copper foil with carrier and embedded in the resin substrate, by removing the ultra-thin copper layer of the first copper foil with carrier after peeling the carrier of the first copper foil with carrier.

In yet another aspect, the present invention is a method for producing a printed wiring board, including:

a step of preparing a metal foil with a circuit formed on the surface thereof;

a step of forming a resin substrate on the surface of the metal foil so as for the circuit to be embedded;

a step of laminating a copper foil with carrier including a carrier, an intermediate layer and an ultra-thin copper layer in this order, via the surface thereof on the ultra-thin copper layer side, on the resin substrate;

a step of obtaining the resin substrate of the present invention by removing the ultra-thin copper layer on the resin substrate after peeling the carrier of the copper foil with carrier;

a step of forming a circuit on the surface of the resin substrate with the ultra-thin copper layer removed therefrom; and a step of exposing the circuit formed on the surface of the metal foil and embedded in the resin substrate by removing the metal foil.

In yet another aspect, the present invention is a method for producing a printed wiring board, including:

a step of forming a circuit on the surface on the ultra-thin copper layer side of a copper foil with carrier including a carrier, an intermediate layer and an ultra-thin copper layer in this order;

a step of forming a resin substrate on the surface on the ultra-thin copper layer side of the copper foil with carrier so as for the circuit to be embedded;

a step of laminating a surface-treated copper foil, via the surface-treated layer side thereof, on the resin substrate;

a step of obtaining the resin substrate of the present invention by removing the surface-treated copper foil on the resin substrate;

a step of forming a circuit on the surface of the resin substrate with the surface-treated copper foil having been removed therefrom;

a step of peeling the carrier of the copper foil with carrier after forming a circuit on the resin substrate; and a step of exposing the circuit formed on the surface on the ultra-thin copper layer side of the copper foil with carrier by removing the ultra-thin copper layer of the copper foil with carrier after peeling the carrier of the copper foil with carrier.

In yet another aspect, the present invention is a method for producing a printed wiring board, including:

a step of preparing a metal foil with a circuit formed on the surface thereof;

a step of forming the resin substrate of the present invention so as for the circuit to be embedded;

a step of forming a circuit on the resin substrate; and a step of exposing the circuit formed on the surface of the metal foil and embedded in the resin substrate by removing the metal foil.

In yet another aspect, the present invention is a method for producing a printed wiring board, including:

a step of forming a circuit on the surface on the ultra-thin copper layer side of a copper foil with carrier including a carrier, an intermediate layer and an ultra-thin copper layer in this order;

a step of forming the resin substrate of the present invention on the surface on the ultra-thin copper layer side of the copper foil with carrier so as for the circuit to be embedded;

a step of forming a circuit on the resin substrate;

a step of peeling the carrier of the copper foil with carrier after forming the circuit on the resin substrate; and a step of exposing the circuit formed on the surface on the ultra-thin copper layer side of the copper foil with carrier and embedded in the resin substrate by removing the ultra-thin copper layer of the copper foil with carrier after peeling the carrier of the copper foil with carrier.

Advantageous Effects of Invention

According to the present invention, it is possible to provide a surface-treated copper foil capable of imparting a profile shape of the substrate surface after removal of the copper foil, capable of maintaining fine wiring formability and implementing satisfactory adhesion of electroless copper plating coating, and a resin substrate provided with the profile shape of the surface.

DESCRIPTION OF EMBODIMENTS

[Resin Substrate]

Figure 1:
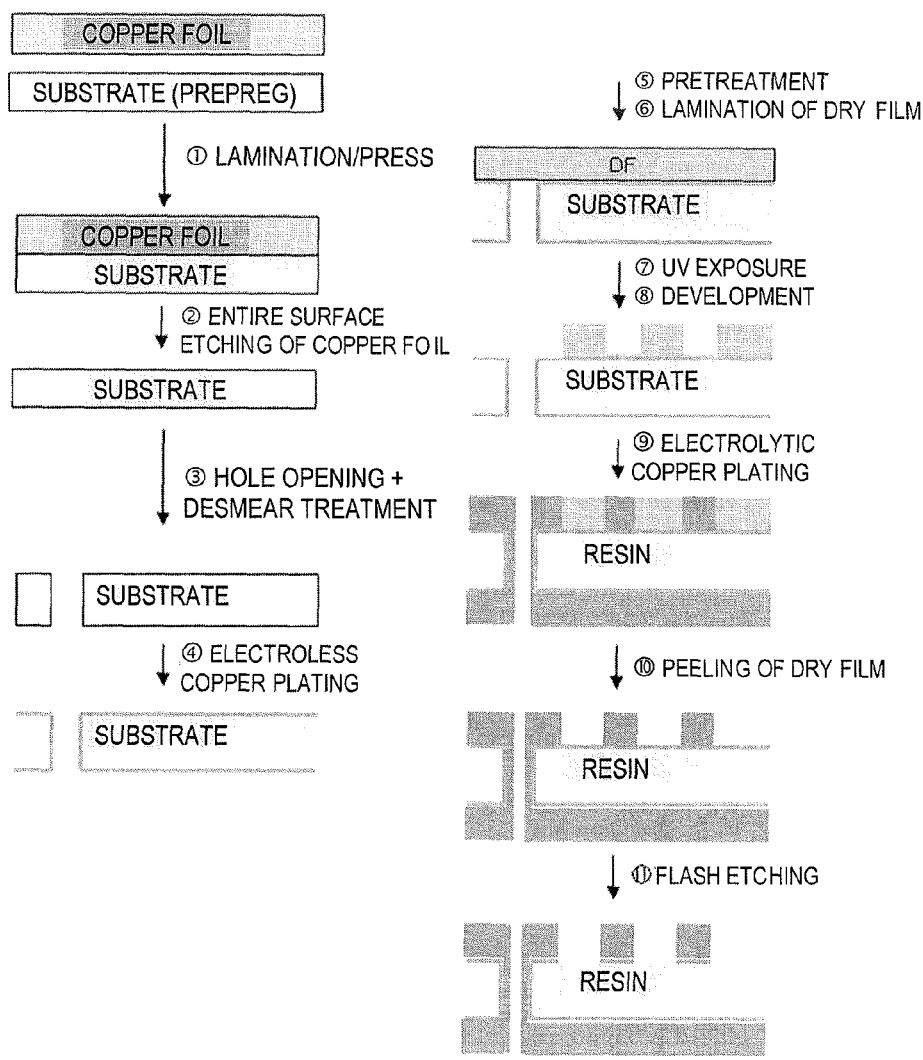
FIG. 1 illustrates a schematic example of a semi-additive method using the profile of a copper foil.

The resin substrate according to the present invention is not particularly limited as long as the resin substrate allows the below-described surface shape to be formed; the resin substrate concerned can be formed with, for example, a prepreg (GHPL-830MBT or the like) manufactured by Mitsubishi Gas Chemical Company, Inc., a prepreg (679-FG or the like) manufactured by Hitachi Chemical Co., Ltd., and a prepreg (EI-6785TS-F or the like) manufactured by Sumitomo Bakelite Co., Ltd. In the present invention, the prepreg GHPL-830MBT manufactured by Mitsubishi Gas Chemical Company, Inc. was prepared. As the temperature, pressure and time of a laminating press, the conditions recommended by the substrate maker were used.

The thickness of the resin substrate according to the present invention is not particularly limited; however, the thickness of the resin substrate can be, for example, 750 to 850 µm, 100 to 200 µm, or 30 to 100 µm, and is typically 30 to 200 µm (in the case of a double-sided plate).

[Surface Roughness Sz of Resin Substrate]

In the SAP method, as a method for quantifying the profile shape of a substrate surface for forming a circuit thereon, the roughness measurement using a contact type roughness meter has hitherto been common. On the contrary, in the present invention, it has been found that the profile shape of the substrate surface having the surface roughness (the maximum height of the surface) Sz as measured with a laser roughness meter, specified to fall within an appropriate range maintains more satisfactorily the fine wiring formability and achieves a satisfactory adhesion of the electroless copper plating coating. From such a viewpoint, the surface roughness Sz of the resin substrate according to the present invention is controlled to be 1 to 5 µm. When the surface roughness Sz of the resin substrate surface is less than 1 µm, it is difficult to achieve a satisfactory adhesion of the electroless copper plating coating. When the surface roughness Sz of the resin substrate surface exceeds 5 µm, the fine wiring formability of the resin substrate surface is degraded. The surface roughness Sz of the resin substrate surface is preferably 1 to 4 µm, more preferably 1.5 to 3.5 µm, and furthermore preferably 2 to 3 µm.

[Area Ratio B/A of Resin Substrate Surface]

The profile shape of the surface of the resin substrate having the ratio between the three-dimensional surface area and the two-dimensional surface area falling within a predetermined range is satisfactory in the fine wiring formability and achieves a satisfactory adhesion of the electroless copper plating coating. From such a viewpoint, the ratio B/A of the three-dimensional surface area B to the two-dimensional surface area A of the surface of the resin substrate according to the present invention is preferably controlled to be 1.01 to 1.5. When the ratio B/A of the three-dimensional surface area B to the two-dimensional surface area A of the surface of the resin substrate is less than 1.01, it is difficult to achieve a satisfactory adhesion of the electroless copper plating coating. When the ratio B/A of the three-dimensional surface area B to the two-dimensional surface area A of the surface of the resin substrate exceeds 1.5, the fine wiring formability of the surface of the resin substrate is degraded. The ratio B/A of the three-dimensional surface area B to the two-dimensional surface area A of the surface of the resin substrate according to the present invention is preferably 1.03 to 1.4, more preferably 1.05 to 1.35 and furthermore preferably 1.1 to 1.3.

[Black Area Rate and Average Value of Diameters of Holes of the Surface of Resin Substrate]

When the degree of asperity of the surface of the resin substrate is represented by the black area rate obtained from the SEM observation photograph, the profile shape of the surface of the resin substrate having the black area rate concerned falling within a predetermined range is satisfactory in fine wiring formability, and achieves a satisfactory adhesion of the electroless copper plating coating. From such a viewpoint, it is preferable that the black area rate of the surface of the resin substrate according to the present invention be controlled so as to be 10 to 50%. As the black area rate, black-white image processing was applied to the SEM image (magnification of 30 k) of the substrate surface, by using Photo Shop 7.0 software, and thus, the area rate (%) of the black region concerned was determined. The black area rate (%) was determined as the rate at the threshold value of 128 by selecting "Histogram" of "Image" found in Photo Shop 7.0. It is to be noted that the black region indicates that the measurement surface is concave, and the white region indicates that the measurement surface is convex. When the black area rate concerned of the substrate surface is less than 15%, it is difficult to achieve a satisfactory adhesion of the electroless copper plating coating. When the black area rate concerned of the substrate surface exceeds 50%, the fine wiring formability is degraded.

The profile shape of the surface of the resin substrate, having the black area rate falling within the predetermined range and at the same time having the average value of the diameters of the holes of the surface falling within the predetermined range is the necessary condition for achieving a satisfactory fine wiring formability and a satisfactory adhesion of the electroless copper plating coating. This is because only the black area rate does not satisfy the size of the profile and the appropriate distribution of the profile on the plane thereof. From such a viewpoint, it is preferable that the average value of the diameters of the holes of the surface of the resin substrate according to the present invention be controlled so as to be 0.03 to 1.0 µm. When the average value of the diameters of the holes concerned of the surface of the resin substrate is less than 0.03 µm, it is difficult to achieve a satisfactory adhesion of the electroless copper plating coating. When the average value of the diameters of the holes concerned of the surface of the resin substrate exceeds 1.0 µm, the fine wiring formability is degraded.

As described above, in the resin substrate according to the present invention, it is preferable that the black area rate concerned of the substrate surface be 10 to 50% and the average value of the diameters of the holes concerned of the substrate surface be 0.03 to 1.0 µm; it is more preferable that the black area rate be 15 to 45% and the average value of the diameters of the holes be 0.1 to 0.8 µm; and it is furthermore preferable that the black area rate be 20 to 40% and the average value of the diameters of the holes be 0.15 to 0.7 µm.

[Method for Forming Surface Profile of Resin Substrate]

The profile shape of the surface of the resin substrate according to the present invention can be formed by laminating a surface-treated copper foil on the resin substrate and by subsequently removing the surface-treated copper foil concerned by entire-surface etching or the like. The profile shape of the surface of the resin substrate according to the present invention can also be formed by treating the surface of the resin substrate with a predetermined chemical solution.

In the method for forming the surface profile of the resin substrate according to the present invention, using a surface-treated copper foil, first there is prepared a surface-treated copper foil controlled so as for the surface roughness (the maximum height of the surface) Sz of the surface of the surface-treated layer to be 2 to 6 µm. Next, the surface-treated copper foil concerned is bonded, via the surface-treated layer side thereof, to the resin substrate, and then the surface-treated copper foil is removed by entire-surface etching or the like. In this way, the surface roughness Sz of the surface of the resin substrate after removing the surface-treated copper foil is 1 to 5

In the present invention, "the surface of the surface-treated layer" means the outermost surface on the surface-treated side. Specifically, when surface-treated layers such as a roughening-treated layer, a rust-preventing layer, a heat resistant layer, a chromate-treated layer and a silane coupling treated layer are provided on a copper foil, the surface of the surface-treated layer means the surface obtained after providing these surface-treated layers concerned on the copper foil.

When as the surface-treated copper foil, a surface-treated copper foil with the ratio B/A of the three-dimensional surface area B to the two-dimensional surface area A of the surface of the surface-treated layer controlled to be 1.05 to 1.8 is used and bonded to the resin substrate in the same manner as described above, and the surface-treated copper foil concerned is removed by entire-surface etching or the like, the ratio B/A of the three-dimensional surface area B to the two-dimensional surface area A of the surface of the resin substrate after removing the surface-treated copper foil is 1.01 to 1.5.

When as the surface-treated copper foil, a surface-treated copper foil having a surface roughness Sz as measured with a laser roughness meter of 2 to 6 μm and having the ratio B/A between the three-dimensional surface area B and the two-dimensional surface area A controlled to be 1.05 to 1.8 is used and bonded to the resin substrate in the same manner as described above, and the surface-treated copper foil concerned is removed by entire-surface etching or the like, the black area rate of the surface of the resin substrate can be controlled to be 10 to 50%, and the average value of the diameters of the holes of the surface of the resin substrate can be controlled to be 0.03 to 1.0 μm.

By controlling the current density for surface treatment during the surface treatment such as during the formation of roughened particles and the immersion time in a plating solution after the completion of the surface treatment, the surface state of the copper foil and the form and the formation density of roughened particles, after the surface treatment are determined, and accordingly, the surface roughness Sz, the area ratio B/A, the black area rate and the average value of the diameters of the holes of the surface-treated copper foil can be controlled.

Specifically, during the surface treatment such as during the formation of roughened particles, by performing the surface treatment with the current density of the surface treatment controlled to be high, and successively performing the surface treatment with the current density of the surface treatment controlled to be low, the surface state of the copper foil and the form and the formation density of roughened particles, after the surface treatment are determined, and the above-described surface roughness Sz, area ratio B/A, black area rate and average value of the diameters of the holes can be controlled. In addition, it is also effective to repeatedly perform the operation that the surface treatment is performed with the current density of the surface treatment controlled to be high, and successively the surface treatment is performed with the current density of the surface treatment controlled to be low.

Here, when the current density is allowed to be high during the surface treatment such as during the formation of roughened particles, the deposited metal particles tend to grow in a direction perpendicular to the surface of the copper foil. In addition, when the current density is allowed to be low during the surface treatment such as during the formation of roughened particles, the surface of the copper foil tends to be smooth (asperities tend to occur to a low degree).

Accordingly, the operation that the surface treatment is performed with the current density of the surface treatment controlled to be high, and successively the surface treatment is performed with the current density of the surface treatment controlled to be low is regarded as the surface state control such that metal particles are allowed to grow in the direction perpendicular to the surface of the copper foil, and subsequently the asperities due to the metal particles and the surface of the cooper foil are embedded so as to form a smooth surface.

In addition, when the surface-treated layer of the copper foil is easily dissolved in a plating solution, the effect of the immersion time in the plating solution after the completion of the surface treatment on the surface form of the surface treated copper foil tends to be more profound.

In the method for forming the surface profile (the above-described surface roughness Sz, area ratio B/A, black area rate and average value of the diameters of the holes) of the resin substrate according to the present invention, based on a treatment using a chemical solution, the surface profile can be formed by applying a desmear treatment to the resin substrate under the following immersion treatment conditions A or B, and by subsequently performing a neutralization treatment.

(Desmear Treatment Conditions A)
Desmear treatment solution: 40 g/L $KMnO_4$, 20 g/L NaOH
Treatment temperature: Room temperature
Immersion time: 20 minutes
Number of rotations of stirrer: 300 rpm (Desmear treatment conditions B)
Desmear treatment solution: 90 g/L $KMnO_4$, 5 g/L HCl
Treatment temperature: 49° C.
Immersion time: 20 minutes
Number of rotations of stirrer: 300 rpm (Neutralization treatment conditions)
Neutralization treatment solution: L-Ascorbic acid 80 g/L
Treatment temperature: Room temperature
Immersion time: 3 minutes
No stirring The remainders of the treatment solutions used in the desmear treatment, electrolysis, surface treatment, plating or the like used in the present invention are water unless otherwise specified.

In addition to the above-described immersion treatment, by performing shower treatments A and B, and a neutralization treatment on the surface of the resin substrate, under the following treatment conditions, it is possible to perform the formation of the surface profile (the surface roughness Sz, area ratio B/A, black area rate, and average value of diameters of holes) of the resin substrate in the same manner as described above.

(Shower Treatment Conditions A)
Desmear treatment solution: 40 g/L $KMnO_4$, 20 g/L NaOH
Treatment temperature: Room temperature
Treatment time: 20 minutes
Shower pressure: 0.2 MPa
(Shower Treatment Conditions B)
Desmear treatment solution: 90 g/L $KMnO_4$, 5 g/L HCl
Treatment temperature: 49° C.
Treatment time: 20 minutes
Shower pressure: 0.2 MPa
(Neutralization Treatment Conditions)
Neutralization treatment solution: L-Ascorbic acid 80 g/L
Treatment temperature: Room temperature
Immersion time: 3 minutes
No stirring

[Surface-Treated Copper Foil]

The surface-treated copper foil of the present invention can be used for forming the surface profile of the resin substrate. The copper foil used in the surface-treated copper foil concerned may either be an electrolytic copper foil or a rolled copper foil. The thickness of the copper foil concerned is not particularly required to be limited; however, the thickness of the copper foil is, for example, 1 μm or more, 2 μm or more, 3 μm or more, or 5 μm or more, and for example, 3000 μm or less, 1500 μm or less, 800 μm or less, 300 μm or less, 150 μm or less, 100 μm or less, 70 μm or less, 50 μm or less, or 40 μm or less.

Examples of the rolled copper foil used in the present invention include copper alloy foils including one or more elements such as Ag, Sn, In, Ti, Zn, Zr, Fe, P, Ni, Si, Te, Cr, Nb, V, B, and Co. When the concentration of the above-described elements is high (for example, 10% by mass or more in total), the conductivity is sometimes degraded. The conductivity of the rolled copper foil is preferably 50% IACS or more, more preferably 60% IACS or more, and furthermore preferably 80% IACS or more. Examples of the rolled copper foil include the copper foils produced by using tough pitch copper (JIS H3100 C1100) or oxygen-free copper (JIS H3100 C1020). It is to be noted that when the term "copper foil" is used alone in the present specification, the term "copper foil" also includes copper alloy foils.

The electrolytic copper foil usable in the present invention can be prepared with the following electrolyte composition and the following production conditions.

Common Electrolytic Raw Foil:
<Electrolyte Composition>
Copper: 80 to 120 g/L
Sulfuric acid: 80 to 120 g/L
Chlorine: 30 to 100 ppm
Leveling agent (glue): 0.1 to 10 ppm
Double-sided flat electrolytic raw foil, and ultra-thin copper foil with carrier:
<Electrolyte Composition>
Copper: 80 to 120 g/L
Sulfuric acid: 80 to 120 g/L
Chlorine: 30 to 100 ppm
Leveling agent 1 (bis(3-sulfopropyl) disulfide): 10 to 30 ppm
Leveling agent 2 (amine compound): 10 to 30 ppm
As the amine compound, an amine compound of the following chemical formula can be used.

[Formula 1]

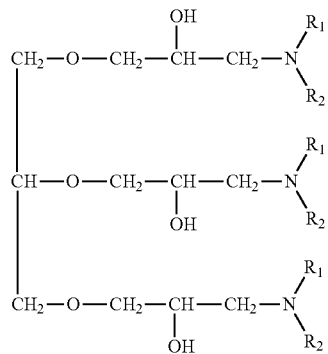

(wherein, in the chemical formula, $R_1$ and $R_2$ are each a group selected from the group consisting of a hydroxyalkyl group, an ether group, an aryl group, an aromatic-substituted alkyl group, an unsaturated hydrocarbon group, and an alkyl group.)

<Production Conditions>
Current density: 70 to 100 A/dm$^2$
Electrolyte temperature: 50 to 65° C.
Linear speed of electrolyte: 1.5 to 5 m/sec
Electrolysis time: 0.5 to 10 minutes (regulated according to deposited copper thickness and current density)

As roughening treatment, there can be used alloy platings such as copper-cobalt-nickel plating, copper-nickel-phosphorus alloy plating, copper-nickel-tungsten alloy plating, and copper-cobalt-tungsten alloy plating; more preferably copper alloy plating can be used. The copper-cobalt-nickel alloy plating as the roughening treatment can be implemented in such a way that ternary alloy layers are formed by electroplating so as to have the following deposition amounts: 15 to 40 mg/dm$^2$ of copper, 100 to 3000 μg/dm$^2$ of cobalt, and 100 to 1500 μg/dm$^2$ of nickel. When the deposition amount of Co is less than 100 μg/dm$^2$, sometimes the heat resistance is degraded and the etching property is also degraded. When the deposition amount of Co exceeds 3000 μg/dm$^2$, such a deposition amount is not favorable in the case where magnetic effect is required to be considered, sometimes causes etching stain, and sometimes degrades acid resistance and chemical resistance. When the deposition amount of Ni is less than 100 μg/dm$^2$, sometimes heat resistance is degraded. On the other hand, when the deposition amount of Ni exceeds 1500 μg/dm$^2$, sometimes etching residue grows. A preferable deposition amount of Co is 1000 to 2500 μg/dm$^2$, and a preferable deposition amount of nickel is 500 to 1200 μg/dm$^2$. Here, the etching stain means that Co remains undissolved in etching with copper chloride, and the etching residue means that Ni remains undissolved in alkaline etching with ammonium chloride.

The plating bath and plating conditions for forming such a ternary copper-cobalt-nickel alloy plating are as follows:
Plating bath composition: Cu 10 to 20 g/L, Co 1 to 10 g/L, Ni 1 to 10 g/L
pH: 1 to 4
Temperature: 30 to 50° C.
Current density $D_k$: 20 to 30 A/dm$^2$
Plating time: 1 to 5 seconds
Immersion time in the same plating solution after completion of plating: 20 seconds or less (because immersion longer than 20 seconds disturbs particle shapes), preferably 10 seconds or less, more preferably 5 seconds or less After completion of the plating, usually the plated product is not taken out from the plating solution particularly in haste; however, in the present invention, after the completion of the plating concerned, it is necessary to take out the plated product from the plating solution within a predetermined time. Accordingly, as described above, the immersion time in the same plating solution after the completion of the plating is set at 20 seconds or less. When the plated product is immersed for the immersion time concerned exceeding 20 seconds, the roughened particles are possibly partially dissolved by the plating solution. The partial dissolution of the roughened particles is considered to give a cause for disturbing the particle shapes.

By setting the immersion time in the same plating solution after the completion of plating to be as short as 10 seconds or less, or 5 seconds or less, the particle shapes can be less disturbed in an effective manner.

In the same manner as in the case of the copper-cobalt-nickel alloy plating, in the case of the alloy plating other than the copper-cobalt-nickel alloy plating, it is important to control the immersion time in the same plating solution after the completion of the plating so as to be 20 seconds or less (because immersion longer than 20 seconds disturbs particle shapes), preferably 10 seconds or less and more preferably 5 seconds or less. With the immersion exceeding 20 seconds in the immersion time concerned, the plating solution possibly partially dissolves the roughened particles. Such a partial dissolution of the roughened particles is considered to be a cause for the disturbance of the particle shapes. Heretofore known conditions can be used for the pH, temperature, current density, and plating time of the alloy plating other than the copper-cobalt-nickel alloy plating.

By setting the immersion time in the same plating solution after the completion of plating to be as short as 10 seconds or less, or 5 seconds or less, the particle shapes can be less disturbed in an effective manner.

In addition, a copper plating as the following roughening treatment may also be performed as a surface treatment. The surface-treated layer formed by the following copper plating as the roughening treatment is high in the copper concentration, and the surface-treated layer becomes a roughening-treated layer (plating layer) mostly constituted with copper. The roughening-treated layer (plating layer) high in copper concentration is characterized by being hardly dissolved in the plating solution. The following copper plating as the roughening treatment is performed in the order of the copper plating 1 and the copper plating 2.

Copper Plating 1
(Solution Composition 1)
Cu concentration: 10 to 30 g/L
$H_2SO_4$ concentration: 50 to 150 g/L
Tungsten concentration: 0.5 to 50 mg/L
Sodium dodecyl sulfate: 0.5 to 50 mg/L
(Electroplating Conditions 1)
Temperature: 30 to 70° C.
(First Stage Current Conditions)
Current density: 18 to 70 A/dm$^2$
Roughening coulomb quantity: 1.8 to 1000 A/dm$^2$, preferably 1.8 to 500 A/dm$^2$
Plating time: 0.1 to 20 seconds
(Second Stage Current Conditions)
Current density: 0.5 to 13 A/dm$^2$
Roughening coulomb quantity: 0.05 to 1000 A/dm$^2$, preferably 0.05 to 500 A/dm$^2$
Plating time: 0.1 to 20 seconds The first stage and the second stage may be repeated. In addition, after the first stage is performed once or a plurality of times, the second stage may also be performed once or a plurality of times. Alternatively, the following operations may also be repeated: after the first stage is performed once or a plurality of times, the second stage is performed once or a plurality of times.

Copper Plating 2
(Solution Composition 2)
Cu concentration: 20 to 80 g/L
$H_2SO_4$ concentration: 50 to 200 g/L
(Electroplating Conditions 2)
Temperature: 30 to 70° C.
(Current Conditions)
Current density: 5 to 50 A/dm$^2$
Roughening coulomb quantity: 50 to 300 A/dm$^2$
Plating time: 1 to 60 seconds Alternatively, on the copper foil, an alloy plating such as the above-described copper-cobalt-nickel alloy plating and the above-described copper plating may be performed in combination. It is preferable to perform the above described alloy plating after the above-described copper plating is performed.

In the present invention, the surface-treated layer formed on the copper foil may be a roughening-treated layer. The roughening treatment usually means a treatment in which nodular electrodeposition is formed on the surface of a copper foil after degreasing, specifically on the copper foil surface adhering to the resin substrate, namely, the surface on the surface-treated side of the copper foil, for the purpose of improving the peel strength of the copper foil after lamination. An electrolytic copper foil has asperities at the time of production; however, by augmenting the protrusions of the electrolytic copper foil by roughening treatment, the asperities can be further grown. The roughening treatment can be performed, for example, by forming roughened particles with copper or a copper alloy. The roughening treatment may be a refined treatment. The roughening-treated layer may be a layer composed of a single substance selected from or an alloy including one or more selected from the group consisting of copper, nickel, cobalt, phosphorus, tungsten, arsenic, molybdenum, chromium and zinc. Additionally, after the roughened particles are formed with copper or a copper alloy, it is also possible to further perform a roughening treatment in which secondary particles or tertiary particles are provided with a single substance or an alloy of nickel, cobalt, copper or zinc. Additionally, on the surface of the roughening-treated layer, one or more layers selected from the group consisting of a heat resistant layer, a rust-preventing layer, a chromate-treated layer and a silane coupling treated layer may be formed.

In the present invention, the surface-treated layer formed on the copper foil may be one or more selected from the group consisting of a roughening-treated layer, a heat resistant layer, a rust-preventing layer, a chromate-treated layer and a silane coupling treated layer.

As the heat resistant layer and the rust-preventing layer, heretofore known heat resistant layers and rust-preventing layers can be used. For example, the heat resistant layer and/or the rust-preventing layer may be a layer including one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum; or a metal layer or an alloy layer composed of one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat resistant layer and/or the rust-preventing layer may also include an oxide, a nitride and a silicide including one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat resistant layer and/or the rust-preventing layer may also be a layer including a nickel-zinc alloy. The heat resistant layer and/or the rust-preventing layer may also be a nickel-zinc alloy layer. The nickel-zinc alloy layer may be a layer containing 50 wt % to 99 wt % of nickel and 50 wt % to 1 wt % of zinc, zinc, except for inevitable impurities. The total deposition amount of zinc and nickel in the nickel-zinc alloy layer may be 5 to 1000 mg/m$^2$, preferably 10 to 500 mg/m$^2$, and preferably 20 to 100 mg/m$^2$. The ratio (=deposition amount of nickel/deposition amount of zinc) between the deposition amount of nickel and the deposition amount of zinc in the nickel-zinc alloy-containing layer or the nickel-zinc alloy layer is preferably 1.5 to 10. The deposition amount of nickel in the layer including a nickel-zinc alloy or the nickel-zinc alloy layer is preferably 0.5 mg/m$^2$ to 500 mg/m$^2$, and more preferably 1 mg/m$^2$ to 50 mg/m$^2$. In the case where the heat resistant layer and/or the rust-preventing layer is a layer including a nickel-zinc alloy, when the inner wall portion of the through-holes, the via holes or the like is brought into contact with the desmear solution, the interface between the copper foil and the resin substrate is hardly corroded by the desmear solution, and the adhesion between the copper foil and the resin substrate is improved.

For example, the heat resistant layer and/or the rust-preventing layer may be a layer formed by sequentially laminating a nickel or nickel alloy layer having a deposition amount of 1 mg/m$^2$ to 100 mg/m$^2$, preferably 5 mg/m$^2$ to 50 mg/m$^2$ and a tin layer having a deposition amount of 1 mg/m$^2$ to 80 mg/m$^2$, preferably 5 mg/m$^2$ to 40 mg/m$^2$, and the nickel alloy layer may be constituted with any one of a nickel-molybdenum alloy, a nickel-zinc alloy, and a nickel-molybdenum-cobalt alloy. In the heat resistant layer and/or the rust-preventing layer, the total deposition amount of nickel or a nickel alloy and tin is preferably 2 mg/m$^2$ to 150 mg/m$^2$ and more preferably 10 mg/m$^2$ to 70 mg/m$^2$. In the heat resistant layer and/or the rust-preventing layer, [nickel deposition amount in the nickel or the nickel alloy]/[tin deposition amount] is preferably 0.25 to 10 and more preferably 0.33 to 3. By using the heat resistant layer concerned and/or the rust-preventing layer, after the processing of the copper foil with carrier into a printed wiring board, the peel strength of the circuit, the degradation rate of the chemical resistance of the peel strength concerned and the like are made satisfactory.

For the silane coupling agent used in the silane coupling treatment, heretofore known silane coupling agents may be used; for example, an amino silane coupling agent, an epoxy silane coupling agent, or a mercapto silane coupling agent may also be used. As the silane coupling agent, for example, the following compounds may be used: vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, γ-aminopropyltriethoxysilane, N-β(aminoethyl)-γ-aminopropyltrimethoxysilane, N-3-(4-(3-aminopropoxy)butoxy)propyl-3-aminopropyltrimethoxysilane, imidazolesilane, triazinesilane, and γ-mercaptopropyltrimethoxysilane.

The silane coupling treated layer may be formed by using, for example, a silane coupling agent such as an epoxy silane, an amino silane, a methacryloxy silane and a mercapto silane. Such silane coupling agents may also be used as mixtures of two or more thereof. The silane coupling treated layer is preferably a layer formed by using, among these, an amino silane coupling agent or an epoxy silane coupling agent.

The amino silane coupling agent as referred to herein may be an amino silane coupling agent selected from the group consisting of N-(2-aminoethyl)-3-aminopropyltrimethoxysilane, 3-(N-styrylmethyl-2-aminoethylamino)propyltrimethoxysilane, 3-aminopropyltriethoxysilane, bis(2-hydroxyethyl)-3-aminopropyltriethoxysilane, aminopropyltrimethoxysilane, N-methylaminopropyltrimethoxysilane, N-phenylaminopropyltrimethoxysilane, N-(3-acryloxy-2-hydroxypropyl)-3-aminopropyltriethoxysilane, 4-aminobutyltriethoxysilane, (aminoethylaminomethyl)phenetyltrimethoxysilane, N-(2-aminoethyl-3-aminopropyl)trimethoxysilane, N-(2-aminoethyl-3-aminopropyl) tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxy)silane, 3-aminopropyltriethoxysilane, 3-aminopropyltrimethoxysilane, ω-aminoundecyltrimethoxysilane, 3-(2-N-benzylaminoethylamino-propyl)trimethoxysilane, bis(2-hydroxyethyl)-3-aminopropyltriethoxysilane, (N,N-diethyl-3-aminopropyl) trimethoxysilane, (N,N-dimethyl-3-aminopropyl) trimethoxysilane, N-methylaminopropyltrimethoxysilane, N-phenylaminopropyltrimethoxysilane, 3-(N-styrylmethyl-2-aminoethylamino)propyltrimethoxysilane, γ-aminopropyltriethoxysilane, N-β(aminoethyl)-γ-aminopropyltrimethoxysilane, and N-3-(4-(3-aminopropoxy)butoxy)propyl-3-aminopropyltrimethoxysilane.

It is desirable that the silane coupling treated layer be formed with an area density falling in the following ranges, in terms of silicon atom: a range from 0.05 mg/m$^2$ to 200 mg/m$^2$, preferably a range from 0.15 mg/m$^2$ to 20 mg/m$^2$, and preferably a range from 0.3 mg/m$^2$ to 2.0 mg/m$^2$. In the case of the foregoing ranges, the adhesion between the substrate and the surface-treated copper foil can be more improved.

[Surface Roughness Sz of Surface-Treated Copper Foil]

In the SAP method, as a method for quantifying the profile shape of a substrate surface for forming a circuit thereon, the roughness measurement using a contact type roughness meter has hitherto been common. On the contrary, in the present invention, it has been found that the profile shape of the substrate surface having the surface roughness (the maximum height of the surface) Sz as measured with a laser roughness meter, specified to fall within an appropriate range maintains more satisfactorily the fine wiring formability and achieves a satisfactory adhesion of the electroless copper plating coating. From such a viewpoint, in the surface-treated copper foil according to the present invention, the surface roughness Sz of the surface of the surface-treated layer is controlled to be 2 to 6 μm. Due to the surface roughness Sz of the surface of the surface-treated layer controlled to be 2 to 6 μm, after the surface-treated copper foil concerned is bonded, via the surface-treated layer side thereof, to the substrate, and then the surface-treated copper foil is removed from the substrate, the surface roughness Sz of the surface, on the copper foil removal side, of the substrate is 1 to 5 μm. When the surface roughness Sz of the surface of the surface-treated layer of the surface-treated copper foil is less than 2 μm, after the surface-treated copper foil concerned is bonded, via the surface-treated layer side thereof, to substrate, and then the surface-treated copper foil is removed from the substrate, the surface roughness Sz of the surface, on the copper foil removal side, of the substrate is less than 1 μm, and it is difficult to achieve the satisfactory adhesion of the electroless copper plating coating. When the surface roughness Sz of the surface of the surface-treated layer of the surface-treated copper foil exceeds 6 μm, after the surface-treated copper foil concerned is bonded, via the surface-treated layer side thereof, to substrate, and then the surface-treated copper foil is removed from the substrate, the surface roughness Sz of the surface, on the copper foil removal side, of the substrate exceeds 5 μm, and the fine wiring formability is degraded. The surface roughness Sz of the surface of the surface-treated layer of the surface-treated copper foil according to the present invention is preferably 2 to 5.5 μm, more preferably 2.5 to 5.5 μm and furthermore preferably 3 to 5 μm. The surface roughness Sz of the substrate surface after the removal of the surface-treated copper foil according to the present invention is preferably 1 to 4 μm, more preferably 1.5 to 3.5 μm and furthermore preferably 2 to 3 μm.

[Area Ratio B/A of Surface-Treated Copper Foil]

The ratio B/A of the three-dimensional surface area B to the two-dimensional surface area A of the surface on the surface-treated side of the surface-treated copper foil significantly affects the profile shape of the surface of the substrate after the surface-treated copper foil concerned is bonded, via the surface-treated layer side thereof, to the substrate, and the surface-treated copper foil is removed. From such a viewpoint, it is preferable that in the surface-treated copper foil according to the present invention, the ratio B/A of the three-dimensional surface area B to the two-dimensional surface area A of the surface of the surface-treated layer be controlled to be 1.05 to 1.8. The ratio B/A of the three-dimensional surface area B to the two-dimensional surface area A of the surface on the surface-treated side can also be said, for example in the case where the surface concerned is roughening-treated, as the ratio B/A of the surface area B of the roughened particles to the area A obtained when the copper foil is plan-viewed from the copper foil surface side. Due to the ratio B/A of the three-dimensional surface area B to the two-dimensional surface area A of the surface on the surface-treated side of the surface-treated copper foil controlled to be 1.05 to 1.8, after the surface-treated copper foil concerned is bonded, via the surface-treated layer side thereof, to the substrate, and then the surface-treated copper foil is removed from the substrate, the ratio B/A of the three-dimensional surface area B to the two-dimensional surface area A of the surface, on the copper foil removal side, of the substrate is 1.01 to 1.5. When the ratio B/A of the three-dimensional surface area B to the two-dimensional surface area A of the surface on the surface-treated side of the surface-treated copper foil is less than 1.05, after the surface-treated copper foil concerned is bonded, via the surface-treated layer side thereof, to the substrate, and then the surface-treated copper foil is removed from the substrate, the ratio B/A of the three-dimensional surface area B to the two-dimensional surface area A of the surface, on the copper foil removal side, of the substrate is less than 1.01, and it is difficult to achieve the satisfactory adhesion of the electroless copper plating coating. When the ratio B/A of the three-dimensional surface area B to the two-dimensional surface area A of the surface on the surface-treated side of the surface-treated copper foil exceeds 1.8, after the surface-treated copper foil concerned is bonded, via the surface-treated layer side thereof, to substrate, and then the surface-treated copper foil is removed from the substrate, the ratio B/A of the three-dimensional surface area B to the two-dimensional surface area A of the surface, on the copper foil removal side, of the substrate exceeds 1.5, and the fine wiring formability is degraded. The ratio B/A of the three-dimensional surface area B to the two-dimensional surface area A of the surface on the surface-treated side of the surface-treated copper foil according to the present invention is preferably 1.10 to 1.75, more preferably 1.14 to 1.71 and furthermore preferably 1.18 to 1.67. The ratio B/A of the three-dimensional surface area B to the two-dimensional surface area A of the substrate surface after removal of the surface-treated copper foil according to the present invention is preferably 1.03 to 1.4, more preferably 1.05 to 1.35 and furthermore preferably 1.1 to 1.3.

[Black Area Rate and Average Value of Diameters of Holes of Surface-Treated Copper Foil]

When the degree of asperity of the substrate surface is represented by the black area rate obtained from the SEM observation photograph, the profile shape of the surface of the substrate having the black area rate concerned falling within a predetermined range is satisfactory in fine wiring formability, and achieves a satisfactory adhesion of the electroless copper plating coating. From such a viewpoint, it is preferable that in the surface-treated copper foil according to the present invention, when the surface-treated copper foil is bonded, via the surface-treated layer side thereof, to the substrate, and then the surface-treated copper foil is removed, the black area rate of the surface, on the copper foil removal side, of the substrate be controlled to be 10 to 50%. As the black area rate, black-white image processing was applied to the SEM image (magnification of 30 k) of the substrate surface, by using Photo Shop 7.0 software, and thus, the area rate (%) of the black region concerned was determined. The black area rate (%) was determined as the rate at the threshold value of 128 by selecting "Histogram" of "Image" found in Photo Shop 7.0. It is to be noted that the black region indicates that the measurement surface is concave, and the white region indicates that the measurement surface is convex. When the black area rate concerned of the substrate surface is less than 10%, it is difficult to achieve a satisfactory adhesion of the electroless copper plating coating. When the black area rate concerned of the substrate surface exceeds 50%, the fine wiring formability is degraded.

The profile shape of the surface of the resin substrate, having the black area rate falling within the predetermined range and at the same time having the average value of the diameters of the holes of the surface falling within the predetermined range is the necessary condition for achieving a satisfactory fine wiring formability and a satisfactory adhesion of the electroless copper plating coating. This is because only the black area rate does not satisfy the size of the profile and the appropriate distribution of the profile on the plane thereof. From such a viewpoint, the average value of the diameters of the holes of the surface of the resin substrate according to the present invention is controlled so as to be 0.03 to 1.0 μm. When the average value of the diameters of the holes concerned of the surface of the resin substrate is less than 0.03 μm, it is difficult to achieve a satisfactory adhesion of the electroless copper plating coating. When the average value of the diameters of the holes concerned of the surface of the resin substrate exceeds 1.0 μm, the fine wiring formability is degraded.

As described above, in the resin substrate according to the present invention, it is preferable that the black area rate concerned of the substrate surface be 10 to 50% and the average value of the diameters of the holes concerned of the substrate surface be 0.03 to 1.0 μm; it is more preferable that the black area rate be 15 to 45% and the average value of the diameters of the holes be 0.1 to 0.8 μm; and it is furthermore preferable that the black area rate be 20 to 40% and the average value of the diameters of the holes be 0.15 to 0.7 μm.

By controlling the current density for surface treatment during the surface treatment such as during the formation of roughened particles and the immersion time in a plating solution after the completion of the surface treatment, the surface state of the copper foil and the form and the formation density of roughened particles, after the surface treatment are determined, and the surface roughness Sz, the area ratio B/A, the black area rate and the average value of the diameters of the holes of the surface-treated copper foil can be controlled.

Specifically, during the surface treatment such as during the formation of roughened particles, by performing the surface treatment with the current density of the surface treatment controlled to be high, and successively performing the surface treatment with the current density of the surface treatment controlled to be low, the surface state of the copper foil and the form and the formation density of roughened particles, after the surface treatment are determined, and the above-described surface roughness Sz, area ratio B/A, black area rate and average value of the diameters of the holes can be controlled. In addition, it is also effective to repeatedly perform the operation that the surface treatment is performed with the current density of the surface treatment controlled to be high, and successively the surface treatment is performed with the current density of the surface treatment controlled to be low.

Here, when the current density is allowed to be high during the surface treatment such as during the formation of roughened particles, the deposited metal particles tend to grow in a direction perpendicular to the surface of the copper foil. In addition, when the current density is allowed to be low during the surface treatment such as during the formation of roughened particles, the surface of the copper foil tends to be smooth (asperities tend to occur to a low degree).

Accordingly, the operation that the surface treatment is performed with the current density of the surface treatment controlled to be high, and successively the surface treatment is performed with the current density of the surface treatment controlled to be low is regarded as the surface state control such that metal particles are allowed to grow in the direction perpendicular to the surface of the copper foil, and subsequently the asperities due to the metal particles and the surface of the cooper foil are embedded so as to form a smooth surface.

In addition, when the surface-treated layer of the copper foil is easily dissolved in a plating solution, the effect of the immersion time in the plating solution after the completion of the surface treatment on the surface form of the surface treated copper foil tends to be more profound.

[Copper Foil with Carrier]

As the surface-treated copper foil according to the present invention, a copper foil with carrier may also be used. The copper foil with carrier includes a carrier, an intermediate layer laminated on the carrier, and an ultra-thin copper layer laminated on the intermediate layer. Alternatively, the copper foil with carrier may include a carrier, an intermediate layer and an ultra-thin copper layer, in this order. The copper foil with carrier may have a surface-treated layer such as a roughening-treated layer on one of or each of both of the surface on the carrier side and the surface on the ultra-thin copper layer side.

In the case where a roughening-treated layer is provided on the surface on the carrier side of the copper foil with carrier, when the copper foil with carrier is laminated, via the surface side thereof on the carrier side concerned, on s support such as a resin substrate, the copper foil with carrier has an advantage that the carrier and the support such as a substrate are hardly peeled from each other.

<Carrier>

In the present invention, a metal foil can be used as a carrier. As the metal foil, copper foil, copper alloy foil, nickel foil, nickel alloy foil, aluminum foil, aluminum alloy foil, iron foil, iron alloy foil, stainless steel foil, zinc foil, zinc alloy foil and the like can be used. Among these, as the carrier, from the viewpoint of the easiness in forming a release layer, it is particularly preferable to use copper foil. The carrier is typically provided in the form of a rolled copper foil or an electrolytic copper foil. In general, electrolytic copper foil is produced by electrolytically depositing copper on a titanium or stainless steel drum from a copper sulfate plating bath, and rolled copper foil is produced by repeating plastic working and heat treatment with a rolling roll. As the material for the copper foil, there can be used, in addition to high purity copper such as tough pitch copper and oxygen-free copper, for example, Sn-containing copper, Ag-containing copper, copper alloy with Cr, Zr, Mg or the like added thereto, and copper alloys such as Corson alloys with Ni, Si and the like added thereto.

The thickness of the carrier usable in the present invention is not particularly limited; the thickness concerned can be appropriately regulated to be a thickness suitable for achieving the role as the carrier, and the thickness concerned is allowed to be 12 µm or more. However, the thickness concerned is too thick, the production cost is increased, and hence, in general, it is preferable to set the thickness to be 35 µm or less. Accordingly, the thickness of the carrier is typically 12 to 70 µm, and more typically 18 to 35 µm.

<Intermediate Layer>

On the carrier, the intermediate layer is provided. Between the carrier and the intermediate layer, another layer may be provided. The intermediate layer used in the present invention is not particularly limited as long as the intermediate layer has a constitution such that the ultra-thin copper layer is hardly peeled from the carrier before the step of laminating the copper foil with carrier on the insulating substrate, and on the other hand, after the step of laminating on the insulating substrate, the ultra-thin copper layer is allowed to be peeled from the carrier. For example, the intermediate layer of the copper foil with carrier of the present invention may include one or two or more selected from the group consisting of Cr, Ni, Co, Fe, Mo, Ti, W, P, Cu, Al, Zn, alloys of these, hydrates of these, oxides of these and organic substances. In addition, the intermediate layer maybe composed of two or more layers.

For example, the intermediate layer can be constituted by forming, from the carrier side, a single metal layer composed of one element selected from the element group constituted with one element selected from the group consisting of Cr, Ni, Co, Fe, Mo, Ti, W, P, Cu, Al and Zn, or an alloy layer composed of one or two or more elements selected from the element group consisting of Cr, Ni, Co, Fe, Mo, Ti, W, P, Cu, Al and Zn, and by forming, on the single metal layer of the alloy layer, a layer composed of hydrates or oxides of one or two or more elements selected from the element group consisting of Cr, Ni, Co, Fe, Mo, Ti, W, P, Cu, Al and Zn.

In addition, for example, the intermediate layer can be constituted by laminating, on the carrier, nickel, a nickel-phosphorus alloy or a nickel-cobalt alloy, and chromium in this order. The adhesion between nickel and copper is higher than the adhesion between chromium and copper, and hence, when the ultra-thin copper layer is peeled, peeling occurs between the ultra-thin copper layer and chromium. For the nickel in the intermediate layer, the barrier effect to prevent the diffusion of the copper component from the carrier to the ultra-thin copper layer is expected. The deposition amount of nickel in the intermediate layer is preferably 100 µg/dm$^2$ or more and 40000 µg/dm$^2$ or less, more preferably 100 µg/dm$^2$ or more and 4000 µg/dm$^2$ or less, more preferably 100 µg/dm$^2$ or more and 2500 µg/dm$^2$ or less, and more preferably 100 µg/dm$^2$ or more and 1000 µg/dm$^2$ or less; the deposition amount of chromium in the intermediate layer is preferably 5 µg/dm$^2$ or more and 100 µg/dm$^2$ or less. When the intermediate layer is provided only on one side, it is preferable to provide a rust-preventing layer such as a Ni plating layer carrier on the opposite side of the carrier. On both sides of the carrier, the intermediate layers may also be provided.

<Ultra-Thin Copper Layer>

On the intermediate layer, the ultra-thin copper layer is provided. Another layer may also be provided between the intermediate layer and the ultra-thin copper layer. The ultra-thin copper layer concerned is the surface-treated copper foil of the present invention. The thickness of the ultra-thin copper layer is not particularly limited, but is generally thinner than the carrier, and for example, 12 μm or less. The thickness of the ultra-thin copper layer is typically 0.5 to 12 μm and more typically 1.5 to 5 μm. In addition, before the ultra-thin copper layer is provided on the intermediate layer, a strike plating using a copper-phosphorus alloy may be performed in order to reduce the pin-holes of the ultra-thin copper layer. For the strike plating, for example, a copper pyrophosphate plating solution may be cited. On both sides of the carrier, ultra-thin copper layers may also be provided.

[Resin Layer on Surface-Treated Layer]

A resin layer may also be provided on the surface-treated layer of the surface-treated copper foil of the present invention. The resin layer may be an insulating resin layer.

The resin layer may be an adhesive, or an insulating resin layer of a semi-cured state (B stage state) for adhesion. The semi-cured state (B stage state) includes a state in which no sticky feeling is sensed when the finger is in contact with the surface, the insulating resin layer can be stored in a state of being superposed, and moreover, curing reaction occurs when undergoing heat treatment.

The resin layer may include a thermocuring resin or may be a thermoplastic resin. The resin layer may include a thermoplastic resin. The type of the above-described resin is not particularly limited; examples of the suitable resins include: epoxy resin, polyimide resin, multifunctional cyanic acid ester compound, maleimide compound, maleimide-based resin, polyvinylacetal resin, urethane resin, polyether sulfone, polyether sulfone resin, aromatic polyamide resin, polyamideimide resin, rubber-modified epoxy resin, phenoxy resin, carboxyl group-modified acrylonitrile-butadiene resin, polyphenylene oxide, bismaleimide triazine resin, thermocuring polyphenylene oxide resin, cyanate ester-based resin, and polybasic carboxylic acid anhydride-containing resin. The resin layer may be a resin layer including a block copolymerized polyimide resin layer, or a resin layer including a block copolymerized polyimide resin and a polymaleimide compound. The epoxy resin can be used without causing any particular problem as long as the epoxy resin has two or more epoxy groups in the molecule thereof, and can be used for the application to electric-electronic material. The epoxy resin is preferably an epoxy resin obtained by epoxidation by using a compound having two or more glycidyl groups in the molecule of the compound. As the epoxy resin, one or mixtures of two or more selected from the group consisting of bisphenol A-type epoxy resin, bisphenol F-type epoxy resin, bisphenol S-type epoxy resin, bisphenol AD-type epoxy resin, novolac type epoxy resin, cresol novolac type epoxy resin, alicyclic epoxy resin, brominated epoxy resin, glycidylamine-type epoxy resin, triglycidyl isocyanurate, glycidylamine compounds such as N,N-diglycidylaniline, glycidyl ester compounds such as tetrahydrophthalic acid diglycidyl ester, phosphorus-containing epoxy resin, biphenyl-type epoxy resin, biphenyl novolac type epoxy resin, tris-hydroxyphenylmethane-type epoxy resin, and tetraphenyl methane-type epoxy resin; or alternatively, the hydrogenated products or the halogenated products of the above-described epoxy resins can also be used.

The resin layer may include heretofore known resins, resin curing agents, compounds, curing promoters, dielectrics (any dielectrics such as dielectrics including inorganic compounds and/or organic compounds, or dielectrics including metal oxides may be used), reaction catalysts, cross-linking agents, polymers, prepregs, skeletal materials and the like. The resin layer may be formed by using the substances (resins, resin curing agents, compounds, curing promoters, dielectrics, reaction catalysts, cross-linking agents, polymers, prepregs, skeletal materials and the like) and/or the methods for forming resin layers, and the apparatuses for forming resin layers described in the following documents: International Publication No. WO 2008/004399, International Publication No. WO 2008/053878, International Publication No. WO 2009/084533, Japanese Patent Laid-Open No. 11-5828, Japanese Patent Laid-Open No. 11-140281, Japanese Patent No. 3184485, International Publication No. WO 97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO 2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO 2006/028207, Japanese Patent No. 4828427, Japanese Patent Laid-Open No. 2009-67029, International Publication No. WO 2006/134868, Japanese Patent No. 5046927, Japanese Patent Laid-Open No. 2009-173017, International Publication No. WO 2007/105635, Japanese Patent No. 5180815, International Publication No. WO 2008/114858, International Publication No. WO 2009/008471, Japanese Patent Laid-Open No. 2011-14727, International Publication No. WO 2009/001850, International Publication No. WO 2009/145179, International Publication No. WO 2011/068157, Japanese Patent Laid-Open No. 2013-19056.

Resin solutions are prepared by dissolving these resins in the solvents such as methyl ethyl ketone (MEK), cyclopentanone, dimethyl formamide, dimethyl acetamide, N-methylpyrrolidone, toluene, methanol, ethanol, propylene glycol monomethyl ether, dimethyl formamide, dimethyl acetamide, cyclohexanone, ethyl cellosolve, N-methyl-2-pyrrolidone, N,N-dimethyl acetamide, and N,N-dimethyl formamide; these resin solutions are applied to the ultra-thin copper layer, or the heat resistant layer, the rust-preventing layer, the chromate-treated layer, or the silane coupling agent layer by, for example, a roll coater method, successively heat-dried, if necessary, to remove the solvent to form a B-stage state. For the drying, for example, a hot air drying furnace may be used, and the drying temperature may be 100 to 250° C., and preferably 130 to 200° C. The composition of the resin layer may be dissolve by using a solvent, to prepare a resin solution having a resin solid content of 3 wt % to 60 wt %, preferably 10 wt % to 40 wt %, and more preferably 25 wt % to 40 wt %. The dissolution by using a mixed solvent composed of methyl ethyl ketone and cyclopentanone is mot preferable at the present stage from an environmental viewpoint.

The surface-treated copper foil provided with the resin layer (surface-treated copper foil with resin) is used in a mode in which the resin layer of the copper foil is superposed on the substrate, then the whole is thermally compression bonded to thermally cure the resin layer, and successively a predetermined wiring pattern is formed on the copper foil. For the copper foil with carrier using the surface-treated copper foil concerned as the ultra-thin copper layer, the copper foil with carrier provided with the resin layer (copper foil with carrier with resin) is used in a mode in which the resin layer of the copper foil is superposed on the substrate, then the whole is thermally compression bonded to thermally cure the resin layer, successively the carrier is peeled to expose the ultra-thin copper layer (naturally, the exposed face is the surface on the intermediate layer side of the ultra-thin copper layer), and a predetermined wiring patter is formed on the exposed ultra-thin copper layer.

When the surface-treated copper foil with resin or the copper foil with resin and carrier is used, it is possible to reduce the number of sheets of prepreg material used during the production of a multilayer printed wiring board. Moreover, it is possible to produce a copper clad laminate when the thickness of the resin layer is allowed to be a thickness capable of ensuring interlayer insulation, or even when no prepreg material is used at all. In this case, it is also possible to further improve the smoothness of the surface of the substrate by undercoating an insulating resin on the surface of the substrate.

When no prepreg material is used, the material cost for the prepreg material can be saved, the laminating step is made simple, thus, economic advantage is provided, the thickness of the produced multilayer printed wiring board is made thinner by the thickness of the prepreg material, and in particular, in the case of a copper foil with resin and carrier, there is provided an advantage that an ultra-thin multilayer printed wiring board having a thickness of one layer of 100 μm or less can be produced. The thickness of the resin layer concerned is preferably 0.1 to 120 μm.

When the thickness of the resin layer is thinner than 0.1 μm, the adhesion is degraded; when the surface-treated copper foil with resin or the copper foil with resin and carrier is laminated on a substrate having an inner layer material, it is sometimes difficult to ensure the inter layer insulation with the circuit of the inner layer material. The total resin layer thickness of the cured resin layer and the semi-cured resin layer is preferably 0.1 μm to 120 μm and practically preferably 35 μm to 120 μm. In such a case, it is preferable that the thickness of the cured resin layer be 5 to 20 μm, and the thickness of the semi-cured resin layer be 15 to 115 μm. This is because when the total resin layer thickness exceeds 120 μm, it is sometimes difficult to produce a thin multilayer printed wiring board; and when the total resin layer thickness is less than 35 μm, although it is easy to form a thin multilayer printed wiring board, the resin layer as the insulating layer between the circuits in the inner layers is too thin, and the insulation between the circuits of the inner layers sometimes tends to be made unstable. When the thickness of the cured resin layer is less than 5 μm, it is sometimes necessary to consider the surface roughness degree of the roughened surface of the copper foil. On the contrary, when the thickness of the cured resin layer exceeds 20 μm, the effect due to the cured resin layer is sometimes not particularly improved, and the total thickness is thick. The cured resin layer may be 3 μm to 30 μm in thickness. The semi-cured resin layer may be 7 μm to 55 μm in thickness. The total thickness of the cured resin layer and the semi-cured resin layer may be 10 μm to 60 μm.

When the surface-treated copper foil with resin or the copper foil with resin and carrier is used in the production of an ultra-thin multilayer printed wiring board, it is preferable for the purpose of reducing the thickness of the multilayer printed wiring board that the thickness of the resin layer be set to be 0.1 μm to 5 μm, more preferably 0.5 μm to 5 μm, and more preferably 1 μm to 5 μm. When the thickness of the resin layer is set to be 0.1 μm to 5 μm, in order to improve the adhesion between the resin layer and the copper foil, after a heat resistant layer and/or a rust-preventing layer and/or a chromate-treated layer and/or a silane coupling treated layer is provided on the surface-treated layer, it is preferable to form a resin layer on the heat resistant layer or the rust-preventing layer or the chromate-treated layer or the silane coupling treated layer.

When the resin layer includes a dielectric, the thickness of the resin layer is preferably 0.1 to 50 μm, preferably 0.5 μm to 25 μm, and more preferably 1.0 μm to 15 μm. The thickness of the resin layer means an average value of the thickness values measured at optional 10 points by cross-sectional observation.

On the other hand, when the thickness of the resin layer is made thicker than 120 μm, it is difficult to form a resin layer having the intended thickness by one step of application, and thus extraneous material cost and extraneous number of steps are needed to be economically disadvantageous. Moreover, the formed resin layer is poor in flexibility, cracks or the like tend to occur during handling the resin layer, and smooth lamination is sometimes made difficult due to the occurrence of excessive resin flow during the thermal compression bonding to the inner layer material.

Moreover, as another product form of the copper foil with resin and carrier, it is also possible to produce in a form of a copper foil with resin, without including the carrier, by coating a resin layer on the ultra-thin copper layer, or the heat resistant layer, or the rust-preventing layer, or the chromate-treated layer, or the silane coupling treated layer, by converting the resin layer into a semi-cured state, and by successively peeling the carrier.

Hereinafter, several examples of the production process of the printed wiring board using the resin substrate according to the present invention. A printed circuit board is completed by mounting electronic components on the printed wiring board.

An embodiment of the method for producing a printed wiring board according to the present invention, using a semi-additive method includes: a step of preparing a surface-treated copper foil and a resin substrate; a step of laminating the surface-treated copper foil, via the surface-treated layer side thereof, on the resin substrate; a step of obtaining the resin substrate of the present invention by removing the surface-treated copper foil on the resin substrate; and a step of forming a circuit on the surface of the resin substrate with the surface-treated copper foil removed therefrom.

FIG. 1 illustrates a schematic example of a semi-additive method using the profile of a copper foil. In the method concerned, the surface profile of the copper foil is used for the formation of the surface profile of the resin substrate. Specifically, first, a copper clad laminate is prepared by laminating the copper foil of the present invention on the resin substrate. Next, the copper foil of the copper clad laminate is subjected to entire-surface etching. Next, electroless copper plating is applied to the surface of the resin substrate (entire-surface etched substrate) with the surface profile of the copper foil transferred thereon. Then, the portion, free from formation of circuit, of the resin substrate (entire-surface etched substrate) is coated with a dry film or the like, and electro (electrolytic) copper plating is applied to the surface, not coated with the dry film, of the electroless copper plating layer. Subsequently, after the dry film is removed, the electroless copper plating formed on the portion free from formation of circuit is removed to form a fine circuit. The fine circuit formed in the present invention adheres to the etched surface of the resin substrate (entire-surface etched substrate) with the surface profile of the copper foil of the present invention transferred thereon, and hence the adhesion (peel strength) of the fine circuit is made satisfactory.

The resin substrate can be a resin substrate incorporating an inner layer circuit. In the present invention, the semi-additive method means a method in which thin electroless plating and/or electrolytic plating is applied on a resin substrate or a copper foil seed layer, and after the formation of a pattern, a conductor pattern is formed by using electroplating or etching. For electroless plating and/or electrolytic plating, copper plating can be used. As the method for forming copper plating, heretofore known methods can be used An embodiment of the method for producing a printed wiring board according to the present invention, using the semi-additive method includes: a step of preparing a copper foil with carrier and a resin substrate; a step of laminating the copper foil with carrier, via the ultra-thin copper layer side thereof, to the resin substrate; a step of peeling the carrier of the copper foil with carrier after the copper foil with carrier and the resin substrate are laminated on each other; a step of obtaining the resin substrate of the present invention by removing the ultra-thin copper layer on the resin substrate after peeling the carrier; and a step of forming a circuit on the surface of the resin substrate with the ultra-thin copper layer removed therefrom.

In the present invention, the semi-additive method means a method in which thin electroless plating is applied on an insulating substrate or a copper foil seed layer, subsequently electrolytic plating is performed if necessary, further subsequently, after formation of a pattern, a conductor pattern is formed by using electroplating and etching.

An embodiment of the method for producing a printed wiring board according to the present invention, using a semi-additive method includes: a step of preparing a copper foil with carrier and an insulating substrate; a step of laminating the copper foil with carrier, via the ultra-thin copper layer side thereof, on the insulating substrate; a step of peeling the carrier of the copper foil with carrier after laminating the copper foil with carrier and the insulating substrate on each other; a step of removing the ultra-thin copper layer on the insulating substrate after peeling the carrier; and a step of forming a circuit on the surface of the insulating substrate with the ultra-thin copper layer removed therefrom.

An embodiment of the method for producing a printed wiring board according to the present invention includes a step of laminating a surface-treated copper foil, via the surface-treated layer side thereof, on the resin substrate of the present invention to form a copper clad laminate, and then forming a circuit by a semi-additive method, a subtractive method, a partly additive method or a modified semi-additive method.

An embodiment of the method for producing a printed wiring board according to the present invention includes: a step of preparing the surface-treated copper foil and an insulating substrate; and a step of laminating the surface-treated copper foil. via the surface-treated layer side thereof, on the insulating substrate to form a copper clad laminate, and then forming a circuit by a semi-additive method, a subtractive method, a partly additive method or a modified semi-additive method.

In the present invention, the subtractive method means a method in which the unnecessary portion of the copper foil on the copper clad laminate is selectively removed by etching or the like to form a conductor pattern.

In the present invention, the partly additive method means a method in which catalyst nuclei are imparted on a substrate including a conductor layer, and including, if necessary, pierced holes for through-holes or via holes, and the substrate is etched to form a conductor circuit; and after a solder resist or a plating resist is provided if necessary, plating up is applied to the through-holes, via holes or the like on the conductor circuit by electroless plating treatment to produce a printed wiring board.

In the present invention, the modified semi-additive method means a method in which a metal foil is laminated on a resin substrate; the non-circuit-formation portion is protected with a plating resist, and the circuit-formation portion is subjected to copper plating up; and then, the resist is removed and the metal foil on the portion other than the circuit-formation portion is removed by (flash) etching to form a circuit on the resin substrate.

An embodiment of the method for producing a printed wiring board according to the present invention includes: a step of laminating a copper foil with carrier, via the ultra-thin copper layer side thereof, on the resin substrate of the present invention; and a step of laminating the copper foil with carrier and the resin substrate on each other, then forming a copper clad laminate by passing through a step of peeling the carrier of the copper foil with carrier, and then forming a circuit by a semi-additive method, a subtractive method, a partly additive method or a modified semi-additive method.

An embodiment of the method for producing a printed wiring board according to the present invention includes: a step of preparing the copper foil with carrier and the insulating substrate of the present invention; a step of laminating the copper foil with carrier, via the ultra-thin copper layer side thereof, on the insulating substrate; and a step of laminating the copper foil with carrier and the insulating substrate on each other, then forming a copper clad laminate by passing through a step of peeling the carrier of the copper foil with carrier, and then forming a circuit by a semi-additive method, a subtractive method, a partly additive method or a modified semi-additive method.

An embodiment of the method for producing a printed wiring board according to the present invention, using the semi-additive method, includes: a step of preparing a metal foil with a circuit formed on the surface thereof; a step of forming a resin substrate on the surface of the metal foil so as for the circuit to be embedded; a step of laminating a surface-treated copper foil or a copper foil with carrier, via the surface-treated layer side thereof or the ultra-thin copper layer side, respectively, on the resin substrate; a step of obtaining the resin substrate of the present invention by removing the surface-treated copper foil or the copper foil with carrier on the resin substrate; a step of forming a circuit on the surface of the resin substrate with the surface-treated copper foil or the copper foil with carrier removed therefrom; and a step of exposing the circuit formed on the surface of the metal foil and embedded in the resin substrate by removing the metal foil.

An embodiment of the method for producing printed wiring board according to the present invention using the semi-additive method, includes: a step of preparing a metal foil with a circuit formed on the surface thereof; a step of forming a resin layer on the surface of the metal foil so as for the circuit to be embedded; a step of laminating the surface-treated copper foil of the present invention, via the surface-treated layer side thereof, on the resin layer; a step of removing the surface-treated copper foil on the resin layer; a step of forming a circuit on the resin layer with the surface-treated copper foil removed therefrom; and a step of exposing the circuit formed on the surface of the metal foil and embedded in the resin layer by removing the metal foil.

An embodiment of the method for producing a printed wiring board according to the present invention, using the semi-additive method, includes: a step of forming a circuit on the surface on the ultra-thin copper layer side of a first copper foil with carrier; a step of forming a resin substrate on the surface on the ultra-thin copper layer side of the first copper foil with carrier so as for the circuit to be embedded; a step of preparing a second copper foil with carrier or a surface-treated copper foil, and laminating the second copper foil with carrier or the surface-treated copper foil, via the ultra-thin copper layer side thereof or the surface-treated layer side, respectively, on the resin substrate; a step of peeling the carrier of the second copper foil with carrier after laminating the second copper foil with carrier or the surface-treated copper foil on the resin substrate; a step of obtaining the resin substrate of the present invention by removing the ultra-thin copper layer or the surface-treated copper foil on the resin substrate after peeling the carrier of the second copper foil with carrier; a step of forming a circuit on the surface of the resin substrate with the ultra-thin copper layer or the surface-treated copper foil removed therefrom; a step of peeling the carrier of the first copper foil with carrier after forming the circuit on the resin substrate; and a step of exposing the circuit formed on the surface on the ultra-thin copper layer side of the first copper foil with carrier and embedded in the resin substrate, by removing the ultra-thin copper layer of the first copper foil with carrier, after peeling the carrier of the first copper foil with carrier.

An embodiment of the method for producing a printed wiring board according to the present invention, using the semi-additive method, includes: a step of adopting the copper foil with carrier of the present invention as a first copper foil with carrier and forming a circuit on the surface on the ultra-thin copper layer side of the first copper foil with carrier; a step of forming a resin layer on the surface on the ultra-thin copper layer side of the first copper foil with carrier so as for the circuit to be embedded; a step of preparing a second copper foil with carrier, and laminating the second copper foil with carrier, via the ultra-thin copper layer side thereof of the second copper foil with carrier, on the resin layer; a step of peeling the carrier of the second copper foil with carrier; a step of removing the ultra-thin copper layer on the resin layer after the peeling of the carrier of the second copper foil with carrier; a step of forming a circuit on the surface of the resin layer with the ultra-thin copper layer removed therefrom; a step of peeling the carrier of the first copper foil with carrier after forming the circuit on the resin layer; and a step of exposing the circuit formed on the surface on the ultra-thin copper layer side of the first copper foil with carrier and embedded in the resin layer, by removing the ultra-thin copper layer of the first copper foil with carrier after peeling the carrier of the first copper foil with carrier.

An embodiment of the method for producing a printed wiring board according to the present invention includes: a step of preparing a metal foil with a circuit formed on the surface thereof, a step of forming the resin substrate of the present invention on the surface of the metal foil so as for the circuit to be embedded, a step of laminating the surface-treated copper foil or the copper foil with carrier, via the surface-treated layer side thereof or the ultra-thin copper layer side, respectively, on the resin substrate, and forming a circuit on the resin layer by a semi-additive method, a subtractive method, a partly additive method or a modified semi-additive method; and a step of exposing the circuit formed on the surface of the metal foil and embedded in the resin substrate by removing the metal foil.

An embodiment of the method for producing a printed wiring board according to the present invention includes: a step of preparing a metal foil with a circuit formed on the surface thereof; a step of forming a resin layer on the surface of the metal foil so as for the circuit to be embedded; a step of laminating the surface-treated copper foil of the present invention, via the surface-treated layer side thereof, on the resin layer, and forming a circuit on the resin layer by a subtractive method, a semi-additive method, a subtractive method, a partly additive method or a modified semi-additive method; and a step of exposing the circuit formed on the surface of the metal foil and embedded in the resin layer by removing the metal foil.

An embodiment of the method for producing a printed wiring board according to the present invention includes: a step of forming a circuit on the surface on the ultra-thin copper layer side of a first copper foil with carrier; a step of forming the resin substrate of the present invention on the surface on the surface on the ultra-thin copper layer side of the first copper foil with carrier so as for the circuit to be embedded; a step of preparing a second copper foil with carrier or a surface-treated copper foil, laminating the second copper foil with carrier or the surface-treated copper foil, via the ultra-thin copper layer side thereof of the second copper foil with carrier or via the surface-treated layer side thereof of the surface-treated copper foil, respectively, on the resin substrate, peeling the carrier of the second copper foil with carrier in the case where the second copper foil with carrier on the resin substrate, and forming a circuit on the resin substrate by a semi-additive method, a subtractive method, a partly additive method/process or a modified semi-additive method; a step of peeling the carrier of the first copper foil with carrier after forming the circuit on the resin substrate; and a step of exposing the circuit formed on the surface on the ultra-thin copper layer side of the first copper foil with carrier and embedded in the resin substrate by removing the ultra-thin copper layer of the first copper foil with carrier after peeling the carrier of the first copper foil with carrier.

An embodiment of the method for producing a printed wiring board according to the present invention includes: a step of adopting the copper foil with carrier of the present invention as a first copper foil with carrier and forming a circuit on the surface on the ultra-thin copper layer side of the first copper foil with carrier; a step of forming a resin layer on the surface on the ultra-thin copper layer side of the first copper foil with carrier so as for the circuit to be embedded; a step of preparing a second copper foil with carrier, laminating the second copper foil with carrier, via the ultra-thin copper layer side thereof of the second copper foil with carrier, on the resin layer, peeling the carrier of the second copper foil with carrier, and forming a circuit on the resin layer by a semi-additive method, a subtractive method, a partly additive method or a modified semi-additive method; and a step of exposing the circuit formed on the surface on the ultra-thin copper layer side of the first copper foil with carrier and embedded in the resin layer by removing the ultra-thin copper layer of the first copper foil with carrier after peeling the carrier of the first copper foil with carrier.

An embodiment of the method for producing a printed wiring board according to the present invention includes:

a step of preparing a metal foil with a circuit formed on the surface thereof;

a step of forming a resin substrate on the surface of the metal foil so as for the circuit to be embedded;

a step of laminating a copper foil with carrier including a carrier, an intermediate layer and an ultra-thin copper layer in this order, via the surface thereof on the ultra-thin copper layer side, on the resin substrate;

a step of obtaining the resin substrate of the present invention by removing the ultra-thin copper layer on the resin substrate after peeling the carrier of the copper foil with carrier;

a step of forming a circuit on the surface of the resin substrate with the ultra-thin copper layer removed therefrom;

and a step of exposing the circuit formed on the surface of the metal foil and embedded in the resin substrate by removing the metal foil.

An embodiment of the method for producing a printed wiring board according to the present invention includes:

a step of forming a circuit on the surface on the ultra-thin copper layer side of a copper foil with carrier including a carrier, an intermediate layer and an ultra-thin copper layer in this order;

a step of forming a resin substrate on the surface on the ultra-thin copper layer side of the copper foil with carrier so as for the circuit to be embedded;

a step of laminating the surface-treated copper foil, via the surface-treated layer side thereof, on the resin substrate;

a step of obtaining the resin substrate of the present invention by removing the surface-treated copper foil on the resin substrate;

a step of forming a circuit on the surface of the resin substrate with the surface-treated copper foil removed therefrom;

a step of peeling the carrier of the copper foil with carrier after forming the circuit on the resin substrate; and a step of exposing the circuit formed on the surface on the ultra-thin copper layer side of the copper foil with carrier and embedded in the resin substrate by removing the ultra-thin copper layer of the copper foil with carrier after peeling the carrier of the copper foil with carrier.

An embodiment of the method for producing a printed wiring board according to the present invention includes:

a step of preparing a metal foil with a circuit formed on the surface thereof;

a step of forming the resin substrate of the present invention on the surface of the metal foil so as for the circuit to be embedded;

a step of preparing a copper foil with carrier including a carrier, an intermediate layer and an ultra-thin copper layer in this order, laminating the copper foil with carrier, via the ultra-thin copper layer side thereof, on the resin substrate, then peeling the carrier of the copper foil with carrier, and then forming a circuit on the resin substrate; and a step of exposing the circuit formed on the surface of the metal foil and embedded in the resin substrate by removing the metal foil.

An embodiment of the method for producing a printed wiring board according to the present invention includes:

a step of forming a circuit on the surface on the ultra-thin copper layer side of the copper foil with carrier including a carrier, an intermediate layer and an ultra-thin copper layer in this order;

a step of forming the resin substrate of the present invention on the surface on the ultra-thin copper layer side of the copper foil with carrier so as for the circuit to be embedded;

a step of laminating a surface-treated copper foil, via the surface-treated layer side thereof, on the resin substrate, and then forming a circuit on the resin substrate;

a step of peeling the carrier of the copper foil with carrier after forming a circuit on the resin substrate; and a step of exposing the circuit formed on the surface on the ultra-thin copper layer side of the copper foil with carrier and embedded in the resin substrate by removing the ultra-thin copper layer of the copper foil with carrier after peeling the carrier of the copper foil with carrier.

An embodiment of the method for producing a printed wiring board according to the present invention, using the semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of obtaining the resin substrate of the present invention by completely removing the ultra-thin copper layer exposed by peeling the carrier, by a method such as etching with a corrosive solution such as an acid or etching with plasma; a step of providing through-holes or/and blind vias in the resin exposed by removing the ultra-thin copper layer by etching; a step of performing desmear treatment in the region including the through-holes or/and blind vias; a step of providing an electroless plating layer in the region including the resin and the through-holes or/and the blind vias; a step of providing a plating resist on the electroless plating layer; a step of exposing the plating resist, and then removing the plating resist in the region where a circuit is to be formed; a step of providing an electrolytic layer in the region where the plating resist is removed and the circuit is to be formed; a step of removing the plating resist; and a step of removing the electroless plating layer in the region other than the region where the circuit is to be formed by flash etching or the like.

In an embodiment, the method for producing a printed wiring board of the present invention includes:

a step of preparing the surface-treated copper foil of the present invention with a circuit formed on the surface thereof on the surface-treated layer formed side, or the copper foil with carrier of the present invention, with a circuit formed on the surface thereof on the ultra-thin copper layer side;

a step of forming a resin layer on the surface of the surface-treated copper foil or the surface of the copper foil with carrier so as for the circuit to be embedded;

a step of forming a circuit on the surface of the resin layer; and a step of exposing the circuit embedded in the resin layer by removing the surface-treated copper foil or the copper foil with carrier.

In an embodiment, the method for producing a printed wiring board of the present invention includes:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, or the surface of the surface-treated copper foil, or the surface of the metal foil with carrier, or the surface of the copper foil with carrier so as for the circuit to be embedded;

a step of laminating the second surface-treated copper foil being the surface-treated copper foil of the present invention, via the surface-treated layer side thereof, on the resin layer, or a step of laminating the second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of removing the surface-treated copper foil on the resin layer, or the ultra-thin copper layer remaining as a result of peeling the carrier of the second copper foil with carrier;

a step of forming a circuit on the surface of the resin layer with the surface-treated copper foil removed therefrom, or the surface of the resin layer with the ultra-thin copper layer removed therefrom; and a step of exposing the circuit embedded in the resin layer after forming the circuit on the resin layer by removing the metal foil, or by removing the first surface-treated copper foil, or by removing the ultra-thin metal layer after peeling the carrier of the metal foil with carrier, or by removing the ultra-thin copper layer after peeling the carrier of the first copper foil with carrier.

In the present invention, the metal foil with carrier includes at least a carrier and an ultra-thin metal layer in this order. As the carrier of the metal foil with carrier, a metal foil can be used. As the metal foil, there can be used copper foil, copper alloy foil, nickel foil, nickel alloy foil, aluminum foil, aluminum alloy foil, iron foil, iron alloy foil, stainless steel foil, zinc foil and zinc alloy foil. The thickness of the metal foil can be set to be 1 to 10000 μm, preferably 2 to 5000 μm, preferably 10 to 1000 μm, preferably 18 to 500 μm, and preferably 35 to 300 μm. As the carrier, a resin substrate, or an plate of an inorganic substance or an organic substance can also be used. The thickness of the resin substrate or the plate of an inorganic substance or an organic substance can be made the same as the above-described thickness of the metal foil.

The carrier and the metal foil may be laminated on each other through the intermediary of an adhesive or a release agent, or an intermediate layer, in a peelable manner. Alternatively, the carrier and the metal foil may be joined to each other by welding, deposition or the like in a peelable manner. When it is difficult to peel the carrier and the metal foil from each other, the joined portion between the carrier and the metal foil is removed by cutting or the like, and then the carrier and the metal foil may be peeled from each other.

The ultra-thin metal layer may be formed of copper, copper alloy, nickel, nickel alloy, aluminum, aluminum alloy, iron, iron alloy, stainless steel, zinc, or zinc alloy. The thickness of the ultra-thin metal layer is allowed to fall within the same range as the thickness range of the ultra-thin copper layer of the copper foil with carrier. The ultra-thin metal layer is preferably an ultra-thin copper layer from the viewpoint of the conductivity of the circuit formed therefrom.

In an embodiment, the method for producing a printed wiring board of the present invention includes:

a step of preparing the surface-treated copper foil of the present invention, with a circuit formed on the surface thereof on the surface-treated layer formed side, or the copper foil with carrier of the present invention, with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, or a step of laminating a metal foil with carrier, via the ultra-thin metal layer side thereof, on the resin layer;

a step of peeling the metal foil with carrier, in the case where the foil laminated on the resin layer is the metal foil with carrier;

a step of removing the metal foil on the resin layer, or the ultra-thin metal layer remaining as a result of peeling the carrier of the metal foil with carrier;

a step of forming a circuit on the surface of the resin layer with the metal foil removed therefrom, or the surface of the resin layer with the ultra-thin copper layer removed therefrom; and a step of exposing the circuit embedded in the resin layer by removing the surface-treated copper foil after forming the circuit on the resin layer, or by removing the ultra-thin copper layer after peeling the carrier of the copper foil with carrier.

In an embodiment, the method for producing a printed wiring board of the present invention includes:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, or the surface of the surface-treated copper foil, or the surface of the metal foil with carrier, or the surface of the copper foil with carrier so as for the circuit to be embedded;

a step of laminating the second surface-treated copper foil being the surface-treated copper foil of the present invention, via the surface-treated layer side thereof, on the resin layer, or a step of laminating the second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of forming a circuit on the resin layer, by using the surface-treated copper foil on the resin layer, or the ultra-thin copper layer remaining as a result of peeling the carrier of the second copper foil with carrier, by a semi-additive method, a subtractive method, a partly additive method or a modified semi-additive method; and a step of exposing the circuit embedded in the resin layer by removing the metal foil after forming a circuit on the resin layer, or by removing the first surface-treated copper foil, or by removing the ultra-thin metal layer after peeling the carrier of the metal foil with carrier, or by removing the ultra-thin copper layer after peeling the carrier of the first copper foil with carrier.

In an embodiment, the method for producing a printed wiring board of the present invention includes:

a step of preparing the surface-treated copper foil of the present invention with a circuit formed on the surface thereof on the surface-treated layer formed side, or the copper foil with carrier of the present invention with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, of a step of laminating a metal foil with carrier, via the ultra-thin copper layer side thereof, on the resin layer;

a step of peeling the carrier of the metal foil with carrier, in the case where the foil laminated on the resin layer is the metal foil with carrier;

a step of forming a circuit on the resin layer, by using the metal foil on the resin layer, or the ultra-thin metal layer remaining as a result of peeling the carrier of the metal foil with carrier, by a semi-additive method, a subtractive method, a partly additive method or a modified semi-additive method; and a step of exposing the circuit embedded in the resin layer, by removing the surface-treated copper foil after forming a circuit on the resin layer, or by removing the ultra-thin copper layer after peeling the carrier of the copper foil with carrier.

In an embodiment of the method for producing a printed wiring board according to the present invention, using a semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate; a step of completely removing the ultra-thin copper layer exposed by peeling the carrier, by a method such as etching with a corrosive solution such as an acid or a method using plasma; a step of providing through-holes or/and blind vias in the resin exposed by removing the ultra-thin copper layer by etching; a step of performing desmear treatment in the region including the through-holes or/and blind vias; a step of providing an electroless plating layer in the region including the resin and the through-holes or/and the blind vias; a step of providing a plating resist on the electroless plating layer; a step of exposing the plating resist, and then removing the plating resist in the region where a circuit is to be formed; a step of providing an electrolytic plating layer in the region where the plating resist is removed and the circuit is to be formed; a step of removing the plating resist; and a step of removing the electroless plating layer in the region other than the region where the circuit is to be formed by flash etching or the like.

Another embodiment of the method for producing a printed wiring board according to the present invention, using a semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of obtaining the resin substrate of the present invention by completely removing the ultra-thin copper layer exposed by peeling the carrier, by a method such as etching with a corrosive solution such as an acid or a method using plasma; a step of providing an electroless plating layer on the surface of the resin exposed by removing the ultra-thin copper layer by etching; a step of providing a plating resist on the electroless plating layer; a step of exposing the plating resist, and then removing the plating resist in the region where a circuit is to be formed; a step of providing an electrolytic plating layer in the region where the plating resist is removed and the circuit is to be formed; a step of removing the plating resist; and a step of removing, by flash etching or the like, the electroless plating layer and the ultra-thin copper layer in the region other than the region where the circuit is to be formed.

Another embodiment of the method for producing a printed wiring board according to the present invention, using a semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of completely removing the ultra-thin copper layer exposed by peeling the carrier, by a method such as etching with a corrosive solution such as an acid or etching with plasma; a step of providing an electroless plating layer on the surface of the resin exposed by removing the ultra-thin copper layer by etching; a step of providing a plating resist on the electroless plating layer; a step of exposing the plating resist, and then removing the plating resist in the region where a circuit is to be formed; a step of providing an electrolytic plating layer in the region where the plating resist is removed and the circuit is to be formed; a step of removing the plating resist; and a step of removing the electroless plating layer and the ultra-thin copper layer in the region other than the region where the circuit is to be formed, by flash etching or the like.

An embodiment of the method for producing a printed wiring board according to the present invention, using a modified semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing through-holes or/and blind vias in the ultra-thin copper layer exposed by peeling the carrier and the resin substrate; a step of obtaining the surface profile of the resin substrate of the present invention by performing desmear treatment in the region including the through-holes or/and blind vias; a step of providing an electroless plating layer in the region including the through-holes or/and blind vias; a step of providing a plating resist on the surface of the ultra-thin copper layer exposed by peeling the carrier; a step of forming a circuit by electrolytic plating after providing the plating resist; a step of removing the plating resist; and a step of removing, by flash etching, the ultra-thin copper layer exposed by removing the plating resist.

An embodiment of the method for producing a printed wiring board according to the present invention, using a modified semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and blind vias; a step of providing an electroless plating layer in the region including the through-holes or/and blind vias; a step of providing a plating resist on the surface of the ultra-thin copper layer exposed by peeling the carrier; a step of forming a circuit by electrolytic plating after providing the plating resist; a step of removing the plating resist; and a step of removing the ultra-thin copper layer exposed by removing the plating resist, by flash etching.

Another embodiment of the method for producing a printed wiring board according to the present invention, using a modified semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing a plating resist on the ultra-thin copper layer exposed by peeling the carrier; a step of exposing the plating resist, and then removing the plating resist in the region where a circuit is to be formed; a step of providing an electrolytic plating layer in the region where the plating resist is removed and the circuit is to be formed; a step of removing the plating resist; and a step of obtaining the surface profile of the resin substrate of the present invention by removing, by flash etching or the like, the electroless plating layer and the ultra-thin copper layer in the region other than the region where the circuit is to be formed.

Another embodiment of the method for producing a printed wiring board according to the present invention, using a modified semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing a plating resist on the ultra-thin copper layer exposed by peeling the carrier; a step of exposing the plating resist, and then removing the plating resist in the region where a circuit is to be formed; a step of providing an electrolytic plating layer in the region where the plating resist is removed and the circuit is to be formed; and a step of removing, by flash etching or the like, the electroless plating layer and the ultra-thin copper layer in the region other than the region where the circuit is to be formed.

An embodiment of the method for producing a printed wiring board according to the present invention, using a partly additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing through-holes or/and blind vias in the ultra-thin copper layer exposed by peeling the carrier and the resin substrate; a step of obtaining the surface profile of the resin substrate of the present invention by performing a desmear treatment in the region including the through-holes or/and blind vias; a step of imparting catalyst nuclei to the region including the through-holes or/and the blind vias; a step of providing an etching resist on the surface of the ultra-thin copper layer exposed by peeling the carrier; a step of forming a circuit pattern by exposing the etching resist; a step of forming a circuit by removing the ultra-thin copper layer and the catalyst nuclei by a method such as etching with a corrosive solution such as an acid or by etching with plasma; a step of removing the etching resist; a step of providing a solder resist or a plating resist on the surface of the resin substrate exposed by removing the ultra-thin copper layer and the catalyst nuclei by a method such as etching with a corrosive solution such as an acid or etching with plasma; and a step of providing an electroless plating layer in the region where neither a solder resist nor a plating resist is provided.

An embodiment of the method for producing a printed wiring board according to the present invention, using a partly additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and the blind vias; a step of imparting catalyst nuclei to the region including the through-holes or/and the blind vias; a step of providing an etching resist on the surface of the ultra-thin copper layer exposed by peeling the carrier; a step of forming a circuit pattern by exposing the etching resist; a step of forming a circuit by removing the ultra-thin copper layer and the catalyst nuclei by a method such as etching with a corrosive solution such as an acid or by etching with plasma; a step of removing the etching resist; a step of providing a solder resist or a plating resist on the surface of the insulating substrate exposed by removing the ultra-thin copper layer and the catalyst nuclei by a method such as etching with a corrosive solution such as an acid or etching with plasma; and a step of providing an electroless plating layer in the region where neither a solder resist nor a plating resist is provided.

An embodiment of the method for producing a printed wiring board according to the present invention, using a subtractive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate; a step of providing through-holes or/and blind vias in the ultra-thin copper layer exposed by peeling the carrier and the resin substrate; a step of obtaining the surface profile of the resin substrate of the present invention by performing a desmear treatment in the region including the through-holes or/and the blind vias; a step of providing an electroless plating layer in the region including the through-holes or/and the blind vias; a step of providing an electrolytic plating layer on the surface of the electroless plating layer; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer, and the electroless plating layer and the electrolytic plating layer, by a method such as etching with a corrosive solution such as an acid or etching with plasma; and a step of removing the etching resist.

An embodiment of the method for producing a printed wiring board according to the present invention, using a subtractive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and the blind vias; a step of providing an electroless plating layer in the region including the through-holes or/and the blind vias; a step of providing an electrolytic plating layer on the surface of the electroless plating layer; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer, and the electroless plating layer and the electrolytic plating layer, by a method such as etching with a corrosive solution such as an acid or etching with plasma; and a step of removing the etching resist.

Another embodiment of the method for producing a printed wiring board according to the present invention, using a subtractive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing through-holes or/and blind vias in the ultra-thin copper layer exposed by peeling the carrier and the resin substrate; a step of obtaining the surface profile of the resin substrate of the present invention by performing a desmear treatment in the region including the through-holes or/and the blind vias; a step of providing an electroless plating layer in the region including the through-holes or/and the blind vias; a step of forming a mask on the surface of the electroless plating layer; a step of providing an electrolytic plating layer on the surface of the electroless plating layer with no mask formed thereon; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer and the electroless plating layer by a method such as etching with a corrosive solution such as an acid or etching with plasma; and a step of removing the etching resist.

Another embodiment of the method for producing a printed wiring board according to the present invention, using a subtractive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and the blind vias; a step of providing an electroless plating layer in the region including the through-holes or/and the blind vias; a step of forming a mask on the surface of the electroless plating layer; a step of providing an electrolytic plating layer on the surface of the electroless plating layer with no mask formed thereon; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer and the electroless plating layer by a method such as etching with a corrosive solution such as an acid or etching with plasma; and a step of removing the etching resist.

The step of providing through-holes or/and blind vias, and the subsequent desmear step may be omitted.

Here, a specific example of the method for producing a printed wiring board, using the copper foil with carrier of the present invention is described in detail.

Step 1: First, a copper foil with carrier (first layer) having an ultra-thin copper layer with a roughening-treated layer on the surface thereof is prepared.

Step 2: Next, a resist is applied on the roughening-treated layer of the ultra-thin copper layer, exposure and development are performed to etch the resist into a predetermined shape.

Step 3: Next, after forming a plating for a circuit, the resist is removed, and thus a circuit plating having a predetermined shape is formed.

Step 4: Next, a resin layer is laminated on the ultra-thin copper layer by providing embedding resin so as for the circuit plating to be covered (so as for the circuit plating to be embedded), and successively another copper foil with carrier (second layer) is made to adhere to the ultra-thin copper layer side.

Step 5: Next, from the copper foil with carrier as the second layer, the carrier is peeled. Alternatively, as the second layer, a copper foil having no carrier may also be used.

Step 6: Next, laser drilling is performed at the predetermined positions of the ultra-thin copper layer as the second layer, or the copper foil and the resin layer, and thus the circuit plating is exposed to form a blind via.

Step 7: Next, copper is implanted into the blind via to form a via fill.

Step 8: Next, on the via fill, a circuit plating is formed in the same manner as in above-described Steps 2 and 3.

Step 9: Next, from the copper foil with carrier as the first layer, the carrier is peeled.

Step 10: Next, by flash etching, the ultra-thin copper layers on both surfaces (in the case where as the second layer, a copper foil is provided, the copper foil is removed) are removed, to expose the surface of the circuit plating in the resin layer.

Step 11: Next, a bump is formed on the circuit plating in the resin layer, and a copper pillar is formed on the solder concerned. In this way, a printed wiring board using the copper foil with carrier of the present invention is prepared.

As the added copper foil with carrier (second layer), the copper foil with carrier of the present invention may be used, a conventional copper foil with carrier may also be used, and moreover, a common copper foil may also be used. In addition, on the circuit on the second layer in Step 8, a layer of a circuit or a plurality of layers of circuits may be formed, and the formation of these circuits may also be performed by a semi-additive method, a subtractive method, a partly additive method or a modified semi-additive method.

According to such a method for producing a printed wiring board as described above, because of the constitution allowing the circuit plating to be embedded in the resin layer, during removing the ultra-thin copper layer by flash etching as in, for example, the step 10, the circuit plating is protected by the resin layer, the shape of the circuit plating is maintained, and accordingly the formation of a fine circuit is facilitated. In addition, because the circuit plating is protected by the resin layer, the migration resistance is improved and the conduction of the circuit wiring is suppressed satisfactorily. Accordingly, the formation of a fine circuit is facilitated. As shown in the step 10 and the step 11, when the ultra-thin copper layer is removed by flash etching, the exposed surface of the circuit plating takes a shape recessed from the resin layer, and hence the formation of a bump on the circuit plating concerned, and moreover the formation of a copper pillar thereon are facilitated to improve the production efficiency.

As the embedding resin (resin, heretofore known resins and prepregs can be used. For example, there can be used BT (bismaleimide triazine) resin, a prepreg being a glass cloth impregnated with BT resin, and the ABF film and ABF manufactured by Ajinomoto Fine-Techno Co., Ltd. As the embedding resin (resin), the resin layer and/or the resin and/or the prepreg described in the present description can also be used.

The copper foil with carrier used as the first layer may have a substrate or a resin layer on the surface of the copper foil with carrier concerned. Because of having the substrate concerned of the resin layer concerned, the copper foil with carrier used as the first layer is supported and hardly undergoes wrinkles to offer an advantage that the productivity is improved. As the substrate or the resin layer, any substrate or any resin layer that has an effect to support the copper foil with carrier used as the first layer can be used. For example, as the substrate or the resin layer, the carriers, prepregs, and resin layers described in the description of the present application, and heretofore known carriers, prepregs, resin layers, metal plates, metal foils, plates of inorganic compounds, foils of inorganic compounds, plates of organic compounds and foils of organic compounds can be used.

In addition, by mounting electronic components and the like on the printed wiring board, a printed circuit board is completed. In the present invention, the "printed wiring board" is defined to include such a printed wiring board with electronic components mounted thereon, a printed circuit board, and a printed substrate.

Additionally, electronic devices may also be fabricated by using the printed wiring board concerned, electronic devices may also be fabricated by using the printed wiring board concerned with electronic components mounted thereon, or electronic devices may also be fabricated by using the printed substrate concerned with electronic components mounted thereon.

EXAMPLES

Hereinafter, Examples of the present invention are described; these Examples are presented for the purpose of better understanding of the present invention and the advantages thereof, and are not intended to limit the present invention.

In present Example, as described below, the surface profile of the resin substrate formed by using a copper foil and the surface profile of the resin substrate formed by using a chemical solution were produced.

1. Formation of Surface Profile of Resin Substrate Using Copper Foil

Figure 2:
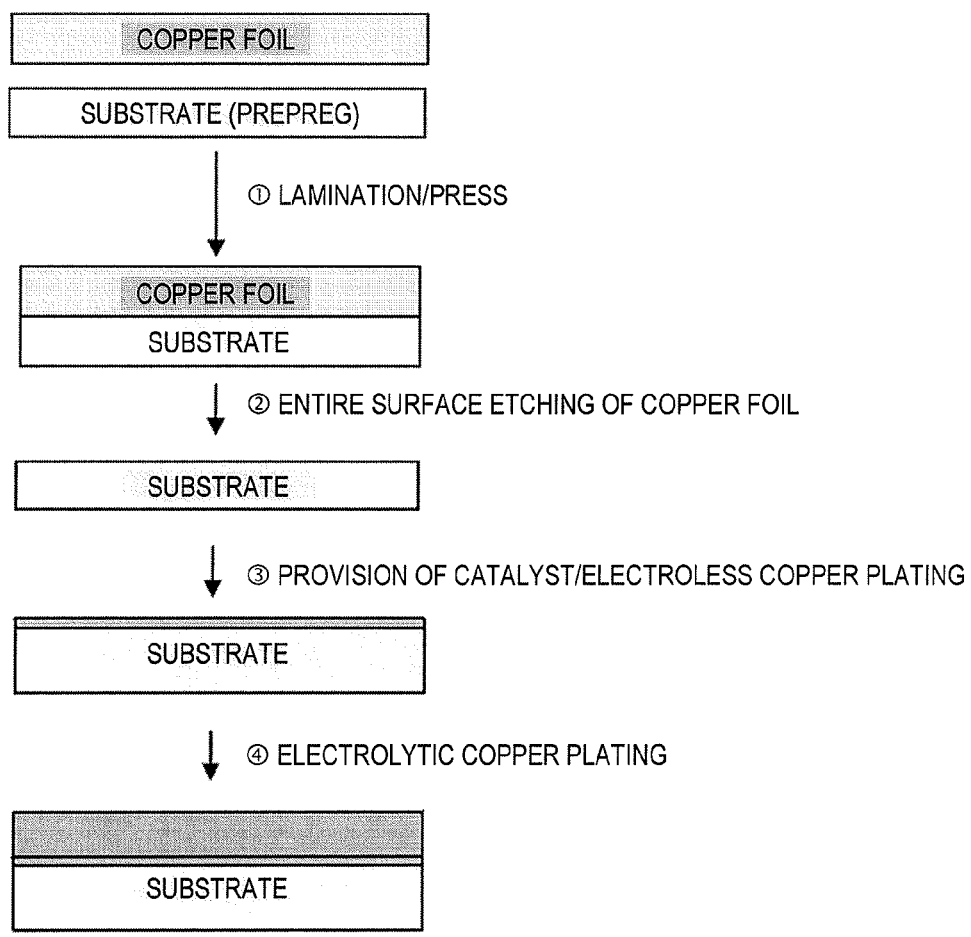
FIG. 2 illustrates a production flow of samples for obtaining the data of Examples and Comparative Examples.

FIG. 2 illustrates a production flow of samples for obtaining the data of Examples and Comparative Examples.

As Examples A1 to A11 and Comparative Examples A1 to A4, and as the copper foils for producing the substrate surface profiles of Examples B1 to B8, Examples B10 to B12 and Comparative Examples B1 to B4, the following copper foil bulk layers (raw foils) were prepared.

Common Electrolytic Raw Foil

A copper sulfate electrolyte having a copper concentration of 80 to 120 g/L, a sulfuric acid concentration of 80 to 120 g/L, a chloride ion concentration of 30 to 100 ppm and a glue concentration of 1 to 5 ppm, and a electrolyte temperature of 57 to 62° C. was used as an electrolytic copper plating bath, a linear speed of the electrolyte flowing between the anode and the cathode (a metal drum for electrodeposition for copper foil) was set at 1.5 to 2.5 m/sec, and a current density was set at 70 A/dm$^2$, and thus, a common electrolytic raw foil having a thickness of 12 μm (thickness in terms of weight per unit area: 95 g/m$^2$) was produced.

Double-Sided Flat Electrolytic Raw Foils

A copper sulfate electrolyte having a copper concentration of 80 to 120 g/L, a sulfuric acid concentration of 80 to 120 g/L, a chloride ion concentration of 30 to 100 ppm, a leveling agent 1 (bis(3-sulfopropyl) disulfide) concentration of 10 to 30 ppm and a leveling agent 2 (an amine compound) concentration of 10 to 30 ppm and a electrolyte temperature of 57 to 62° C. was used as an electrolytic copper plating bath, a linear speed of the electrolyte flowing between the anode and the cathode (a metal drum for electrodeposition for copper foil) was set at 1.5 to 2.5 m/sec, and a current density was set at 70 A/dm$^2$, and thus, a double flat sided electrolytic raw foil having a thickness of 12 μm (thickness in terms of weight per unit area: 95 g/m$^2$) was produced. As the amine compound, an amine compound represented by the following chemical formula was used.

[Formula 2]

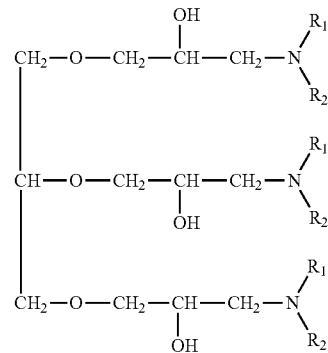

(wherein, in the chemical formula, $R_1$ and $R_2$ are each a group selected from the group consisting of a hydroxyalkyl group, an ether group, an aryl group, an aromatic-substituted alkyl group, an unsaturated hydrocarbon group and an alkyl group.)

Ultra-Thin Raw Copper Foil with Carrier

Under the above-described production conditions of the double flat sided electrolytic raw foil, a double flat sided electrolytic raw foil having a thickness of 18 μm was produced. By using this as a copper foil carrier, a release layer and an ultra-thin copper layer were formed by the following methods, and thus ultra-thin copper foils with carrier having thicknesses of 1.5, 2, 3 and 5 μm were obtained.

(1) Ni Layer (Release Layer: Base Plating 1)

On the S surface of the copper foil carrier, a Ni layer having a deposition amount of 1000 μg/dm$^2$ was formed by performing electroplating with a roll-to-roll type continuous plating line under the following conditions. The specific plating conditions are shown below.

Nickel sulfate: 270 to 280 g/L
Nickel chloride: 35 to 45 g/L
Nickel acetate: 10 to 20 g/L Boric acid: 30 to 40 g/L
Gloss agent: Saccharin, butynediol and the like
Sodium dodecyl sulfate: 55 to 75 ppm
pH: 4 to 6
Bath temperature: 55 to 65° C.
Current density: 10 A/dm$^2$ (2) Cr Layer (Release Layer: Base Plating 2)

Next, after the surface of the Ni layer formed in (1) was washed with water and washed with an acid, successively on the roll-to-roll type continuous plating line, on the Ni layer, a Cr layer having a deposition amount of 11 μg/dm$^2$ was attached by performing an electrolytic chromate treatment under the following conditions.

Potassium bichromate: 1 to 10 g/L, zinc: 0 g/L
pH: 7 to 10
Solution temperature: 40 to 60° C.
Current density: 2 A/dm$^2$ (3) Ultra-Thin Copper Layer Next, after the surface of the Cr layer formed in (2) was washed with water and washed with an acid, successively on the roll-to-roll type continuous plating line, on the Cr layer, ultra-thin copper layers having thicknesses of 1.5, 2, 3 and 5 μm were formed by performing electroplating under the following conditions, and thus ultra-thin copper foils with carrier were produced.

Copper concentration: 80 to 120 g/L
Sulfuric acid concentration: 80 to 120 g/L
Chloride ion concentration: 30 to 100 ppm
Leveling agent 1 (bis(3-sulfopropyl) disulfide): 10 to 30 ppm
Leveling agent 2 (amine compound): 10 to 30 ppm As the leveling agent 2, the following amine compound was used. As the amine compound, an amine compound represented by the following chemical formula was used.

[Formula 3]

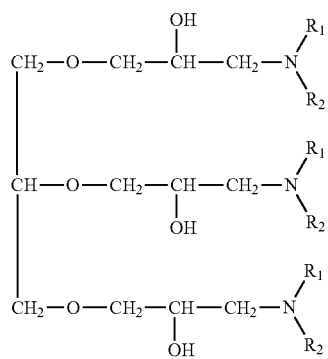

(wherein, in the chemical formula, R$_1$ and R$_2$ are each a group selected from the group consisting of a hydroxyalkyl group, an ether group, an aryl group, an aromatic-substituted alkyl group, an unsaturated hydrocarbon group and an alkyl group.)

Electrolyte temperature: 50 to 80° C.
Current density: 100 A/dm$^2$

Next, on the M surface (matte surface), namely, the surface, on the side adhering to the resin substrate, of the raw foil resin substrate or the S surface (shiny surface) of the raw foil, the surface treatments, namely, a roughening treatment, a barrier treatment, a rust-preventing treatment and an application of a silane coupling agent were applied in this order. The treatment conditions are shown below.

[Roughening Treatment]
Spherical Roughening (Ordinary):

The M surface or the S surface of each of the above-described various raw foils were subjected to the roughening treatment under the following conditions.

(Electrolyte Composition)
Cu: 20 to 30 g/L (added as copper sulfate pentahydrate, the same applies hereinafter)
H$_2$SO$_4$: 80 to 120 g/L
Arsenic: 1.0 to 2.0 g/L
(Electrolyte Temperature)
35 to 40° C.
(Current Condition)
Current density: 70 A/dm$^2$ On the M surface of each of the various copper foils and the surface of each of the ultra-thin copper foils with carrier, subjected to the roughening treatment under the above-described conditions, a covering plating was performed in a copper electrolyte bath composed of sulfuric acid and copper sulfate, in order to prevent the dropout of roughened particles and improving the peel strength. The covering plating conditions are shown below.

(Electrolyte Composition)
Cu: 40 to 50 g/L
H$_2$SO$_4$: 80 to 120 g/L
(Electrolyte Temperature)
43 to 47° C.
(Current Condition)
Current density: 29 A/dm$^2$ Fine Roughening (1):

The M surface of each of the above-described various raw foil and the surface of each of the above-described various ultra-thin raw copper foils with carrier were subjected to a roughening treatment under the following conditions.

(Electrolyte Composition)
Cu concentration: 10 to 20 g/L
H$_2$SO$_4$ concentration: 80 to 120 g/L
Tungsten concentration: 1 to 10 mg/L (added as sodium tungstate dihydrate)
Sodium dodecyl sulfate concentration: 1 to 10 mg/L
(Electrolyte Temperature)
35 to 45° C.
(Current Conditions)

In order to obtain the predetermined hole shapes, current was imparted in four stages. The current densities were set as follows.

First stage: 30 A/dm$^2$
Second stage: 10 A/dm$^2$
Third stage: 30 A/dm$^2$
Fourth stage: 10 A/dm$^2$ On the M surface of each of the various copper foils and the surface of each of the ultra-thin copper foils with carrier, subjected to the roughening treatment under the above-described conditions, a covering plating was performed in a copper electrolyte bath composed of sulfuric acid and copper sulfate, in order to prevent the dropout of roughened particles and improving the peel strength. The covering plating conditions are described below.

(Electrolyte Composition)
Cu: 40 to 50 g/L
H$_2$SO$_4$: 80 to 120 g/L
(Electrolyte Temperature)
43 to 47° C.
(Current Condition)
Current density: 41 A/dm$^2$ Fine Roughening (2):

The surface of each of the above-described ultra-thin raw copper foils with carrier were subjected to a roughening treatment under the following conditions.

(Electrolyte Composition)
Cu concentration: 10 to 20 g/L
$H_2SO_4$ concentration: 80 to 120 g/L
Tungsten concentration: 1 to 10 mg/L (added as sodium tungstate dihydrate)
Sodium dodecyl sulfate concentration: 1 to 10 mg/L
(Electrolyte Temperature)
35 to 45° C.
(Current Conditions)
In order to obtain the predetermined hole shapes, a two-stage process was applied. The current densities were set as follows.
First stage: 50 A/dm$^2$
Second stage: 10 A/dm$^2$ On the M surface of each of the various copper foils and the surface of each of the ultra-thin copper foils with carrier, subjected to the roughening treatment under the above-described conditions, a covering plating was performed in a copper electrolyte bath composed of sulfuric acid and copper sulfate, in order to prevent the dropout of roughened particles and improving the peel strength. The covering plating conditions are described below.

(Electrolyte Composition)
Cu: 40 to 50 g/L
$H_2SO_4$: 80 to 120 g/L
(Electrolyte Temperature)
43 to 47° C.
(Current Condition)
Current density: 41 A/dm$^2$ Fine Roughening (3):

The M surface of each of the above-described double flat sided electrolytic raw foils, and the surface of each of the above-described various ultra-thin raw copper foils with carrier were subjected to a roughening treatment under the following conditions.

(Electrolyte Composition)
Cu: 10 to 20 g/L
Co: 1 to 10 g/L
Ni: 1 to 10 g/L
pH: 1 to 4
(Electrolyte Temperature)
40 to 50° C.
(Current Condition)
Current density: 25 A/dm$^2$
(Immersion Time in Plating Solution after Completion of Plating)
In order to obtain a predetermined hole shape, the immersion time was set within 5 seconds.

The M surface of each of the double flat sided copper foils and the surface of each of the ultra-thin copper foils with carrier, subjected to the roughening treatment under the above-described conditions, were subjected to a covering Co—Ni plating. The covering plating conditions are described below.

(Electrolyte Composition)
Co: 1 to 30 g/L
Ni: 1 to 30 g/L
pH: 1.0 to 3.5
(Electrolyte Temperature)
30 to 80° C.
(Current Condition)
Current density: 5.0 A/dm$^2$ Fine Roughening (4):

The surface of each of the above-described ultra-thin raw copper foils with carrier was subjected to a roughening treatment to form primary particles and secondary particles under the following conditions.

Formation of Primary Particles:
(Electrolyte Composition)
Cu concentration: 10 to 20 g/L
$H_2SO_4$ concentration: 80 to 120 g/L
Tungsten concentration: 1 to 10 mg/L (added as sodium tungstate dihydrate)
Sodium dodecyl sulfate concentration: 1 to 10 mg/L
(Electrolyte Temperature)
35 to 45° C.
(Current Conditions)
In order to obtain the predetermined hole shapes, a two-stage process was applied. The current densities were set as follows.
First stage: 50 A/dm$^2$
Second stage: 10 A/dm$^2$ On the surface of each of the ultra-thin copper foils with carrier, subjected to the formation of primary roughened particles under the above-described conditions, a covering plating was performed in a copper electrolyte bath composed of sulfuric acid and copper sulfate, in order to prevent the dropout of the primary roughened particles and improving the peel strength. The covering plating conditions are described below.

(Electrolyte Composition)
Cu: 40 to 50 g/L
$H_2SO_4$: 80 to 120 g/L
(Electrolyte Temperature)
43 to 47° C.
(Current Condition)
Current density: 41 A/dm$^2$ Formation of Secondary Particles:

Next, a roughening treatment to form secondary roughened particles on the primary roughened particles of each of the ultra-thin copper foils with carrier was performed.

(Electrolyte Composition)
Cu: 10 to 20 g/L
Co: 1 to 10 g/L
Ni: 1 to 10 g/L
pH: 1 to 4
(Electrolyte Temperature)
40 to 50° C.
(Current Condition)
Current density: 25 A/dm$^2$
(Immersion time in plating solution after completion of plating)
In order to obtain a predetermined hole shape, the immersion time was set within 5 seconds.

The surface of each of the ultra-thin copper foils with carrier, subjected to the secondary particle roughening treatment under the above-described conditions, were subjected to a covering Co—Ni plating. The covering plating conditions are described below.

(Electrolyte Composition)
Co: 1 to 30 g/L
Ni: 1 to 30 g/L
pH: 1.0 to 3.5
(Electrolyte Temperature)
30 to 80° C.
(Current Condition)
Current density: 5.0 A/dm$^2$ Fine Roughening (5):

A roughening treatment to form the primary particles and the secondary particles on the surface of each of the above-described ultra-thin raw copper foils with carrier was performed.

Formation of Primary Particles:
(Electrolyte Composition)
Cu concentration: 10 to 20 g/L
$H_2SO_4$ concentration: 80 to 120 g/L
Tungsten concentration: 1 to 10 mg/L (added as sodium tungstate dihydrate)
Sodium dodecyl sulfate concentration: 1 to 10 mg/L
(Electrolyte Temperature)
35 to 45° C.
(Current Conditions)
In order to obtain the predetermined hole shapes, a two-stage process was applied. The current densities were set as follows.
First stage: 20 A/dm$^2$
Second stage: 10 A/dm$^2$ On the surface of each of the ultra-thin copper foils with carrier, subjected to the formation of primary roughened particles under the above-described conditions, a covering plating was performed in a copper electrolyte bath composed of sulfuric acid and copper sulfate, in order to prevent the dropout of the primary roughened particles and improving the peel strength. The covering plating conditions are described below.

(Electrolyte Composition)
Cu: 40 to 50 g/L
$H_2SO_4$: 80 to 120 g/L
(Electrolyte Temperature)
43 to 47° C.
(Current Condition)
Current density: 41 A/dm$^2$ Formation of Secondary Particles:
Next, a roughening treatment to form secondary roughened particles on the primary roughened particles of each of the ultra-thin copper foils with carrier was performed.
(Electrolyte Composition)
Cu: 10 to 20 g/L
Co: 1 to 10 g/L
Ni: 1 to 10 g/L
pH: 1 to 4
(Electrolyte Temperature)
40 to 50° C.
(Current Condition)
Current density: 25 A/dm$^2$
(Immersion Time in Plating Solution after Completion of Plating)
In order to obtain a predetermined hole shape, the immersion time was set to be 15 to 20 seconds.

The surface of each of the ultra-thin copper foils with carrier, subjected to the secondary particle roughening treatment under the above-described conditions, were subjected to a covering Co—Ni plating. The covering plating conditions are described below.

(Electrolyte Composition)
Co: 1 to 30 g/L
Ni: 1 to 30 g/L
pH: 1.0 to 3.5
(Electrolyte Temperature)
30 to 80° C.
(Current Condition)
Current density: 5.0 A/dm$^2$ Fine Roughening (6):

The surface of each of the above-described ultra-thin raw copper foil with carrier was subjected to a roughening treatment under the following conditions.
(Electrolyte Composition)
Cu concentration: 10 to 20 g/L
$H_2SO_4$ concentration: 80 to 120 g/L
Tungsten concentration: 1 to 10 mg/L (added as sodium tungstate dihydrate)
Sodium dodecyl sulfate concentration: 1 to 10 mg/L
(Electrolyte Temperature)
35 to 45° C.
(Current Conditions)
In order to obtain the predetermined hole shapes, a four-stage process was applied. The current densities were set as follows.
First stage: 50 A/dm$^2$
Second stage: 10 A/dm$^2$
Third stage: 50 A/dm$^2$
Fourth stage: 10 A/dm$^2$ On the M surface of each of the various copper foils and the surface of each of the ultra-thin copper foils with carrier, subjected to the roughening treatment under the above-described conditions, a covering plating was performed in a copper electrolyte bath composed of sulfuric acid and copper sulfate, in order to prevent the dropout of roughened particles and improving the peel strength. The covering plating conditions are described below.

(Electrolyte Composition)
Cu: 40 to 50 g/L
$H_2SO_4$: 80 to 120 g/L
(Electrolyte Temperature)
43 to 47° C.
(Current Condition)
Current density: 41 A/dm$^2$ Fine Roughening (7):

A roughening treatment to form the primary particles and the secondary particles on the surface of each of the above-described ultra-thin raw copper foils with carrier was performed.

Formation of Primary Particles:
(Electrolyte Composition)
Cu concentration: 10 to 20 g/L
$H_2SO_4$ concentration: 80 to 120 g/L
Tungsten concentration: 1 to 10 mg/L (added as sodium tungstate dihydrate)
Sodium dodecyl sulfate concentration: 1 to 10 mg/L
(Electrolyte Temperature)
35 to 45° C.
(Current Conditions)
In order to obtain the predetermined hole shapes, a three-stage process was applied. The current densities were set as follows.
First stage: 25 A/dm$^2$
Second stage: 10 A/dm$^2$
Third stage: 5 A/dm$^2$ On the surface of each of the ultra-thin copper foils with carrier, subjected to the formation of primary roughened particles under the above-described conditions, a covering plating was performed in a copper electrolyte bath composed of sulfuric acid and copper sulfate, in order to prevent the dropout of the primary roughened particles and improving the peel strength. The covering plating conditions are described below.
(Electrolyte Composition)
Cu: 40 to 50 g/L
$H_2SO_4$: 80 to 120 g/L (Electrolyte Temperature)
43 to 47° C.
(Current Condition)
Current density: 41 A/dm²
Formation of Secondary Particles:
Next, a roughening treatment to form secondary roughened particles on the primary roughened particles of each of the ultra-thin copper foils with carrier was performed.
(Electrolyte Composition)
Cu: 10 to 20 g/L
Co: 1 to 10 g/L
Ni: 1 to 10 g/L
pH: 1 to 4
(Electrolyte Temperature)
40 to 50° C.
(Current Condition)
Current density: 25 A/dm²
(Immersion Time in Plating Solution after Completion of Plating)
In order to obtain a predetermined hole shape, the immersion time was set to be 5 to 10 seconds.
The surface of each of the ultra-thin copper foils with carrier, subjected to the secondary particle roughening treatment under the above-described conditions, were subjected to a covering Co—Ni plating. The covering plating conditions are described below.
(Electrolyte Composition)
Co: 1 to 30 g/L
Ni: 1 to 30 g/L
pH: 1.0 to 3.5
(Electrolyte Temperature)
30 to 80° C.
(Current Condition)
Current density: 5.0 A/dm²
[Barrier (Heat Resistance) Treatment]
A barrier (heat resistance) treatment was performed under the following conditions, to form a brass plating layer or a zinc-nickel alloy plating layer.
Formation conditions of barrier layers (brass plating) of Example A6, comparative Examples A2 and A3, Example B6, and Comparative Examples B2 and B3:
By using a brass plating bath having a copper concentration of 50 to 80 g/L, a zinc concentration of 2 to 10 g/L, a sodium hydroxide concentration of 50 to 80 g/L, a sodium cyanate concentration of 5 to 30 g/L, and being set at a temperature of 60 to 90° C., a plating electric quantity of 30 As/dm² was imparted to the M surface having a roughening-treated layer formed thereon, at a current density of 5 to 10 A/dm² (multistage treatment).
Formation conditions of barrier layers (zinc-nickel plating) of Example A3, Comparative Example A1, Example B3 and Comparative Example B1:
By using a plating bath containing, as added therein, Ni: 10 g/L to 30 g/L, Zn: 1 g/L to 15 g/L, sulfuric acid ($H_2SO_4$): 1 g/L to 12 g/L, and chloride ion: 0 g/L to 5 g/L, a plating electric quantity of 5.5 As/dm² was imparted to the M surface having a roughening-treated layer formed thereon, at a current density of 1.3 A/dm².

[Rust-Preventing Treatment]
A rust-preventing treatment (chromate treatment) was performed under the following conditions to form a rust-preventing layer.
(Chromate conditions) In a chromate bath containing $CrO_2$: 2.5 g/L, Zn: 0.7 g/L, and $Na_2SO_4$: 10 g/L, having a pH 4.8, and being set at 54° C., an electric quantity of 0.7 As/dm² was added. Moreover, immediately after the completion of the rust-preventing treatment in the chromate bath, by using a liquid shower pipe, the whole roughening-treated surface was subjected to a showering by using the same chromate bath.

[Application of Silane Coupling Agent]
A silane coupling agent application treatment was performed by spraying a solution containing 0.2 to 2% of an alkoxysilane and having a pH of 7 to 8 to the roughening-treated surface of a copper foil.
Moreover, in each of Examples A8 and B8, after the rust-preventing treatment and the application of a silane coupling agent, a resin layer was formed under the following conditions.
(Example of Resin Synthesis)
In a 2-liter three-necked flask equipped with a stainless steel anchor-type stirring rod, a nitrogen introduction tube and a reflux condenser equipped with a bulb condenser equipped on the top of a trap with stopcock, 117.68 g (400 mmol) of 3,4,3',4'-biphenyltetracarboxylic acid dihydrate, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (hereinafter denoted as NMP), and 20 g of toluene were added, the resulting mixture was heated at 180° C. for 1 hour and then cooled to around room temperature, subsequently 29.42 g (100 mmol) of 3,4,3',4'-biphenyltetracarboxylic acid dihydrate, 82.12 g (200 mmol) of 2,2-bis[4-(4-aminophenoxy)phenyl]propane, 200 g of NMP and 40 g of toluene were added to the mixture, the resulting mixture was mixed at room temperature for 1 hour and then heated at 180° C. for 3 hours, and thus a block copolymerized polyimide having a solid content of 38%. This block copolymerized polyimide had a ratio between the following general formulas (1) and (2), the general formula (1): the general formula (2)=3:2, a number average molecular weight of 70000, and a weight average molecular weight of 150000.

[Formula 4]

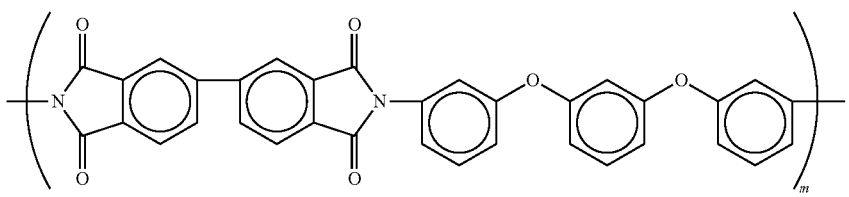

(1)

-continued

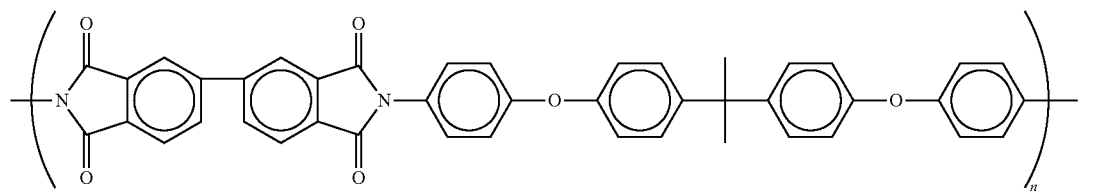

(2)

The block copolymerized polyimide solution obtained in the synthesis example was further diluted with NMP into a block copolymerized polyimide solution having a solid content of 10%. To this block copolymerized polyimide solution, bis(4-maleimidephenyl)methane (BMI-H, K•I Chemical Industry Co., Ltd.) was added so as to have a solid content proportion of 35 in relation to a solid content proportion of the block copolymerized polyimide of 65 (specifically, the solid content weight of the bis(4-maleimidephenyl)methane contained in the resin solution: the solid content weight of the block copolymerized polyimide=35:65), and the resulting solution was dissolved and mixed at 60° C. for 20 minutes to yield a resin solution. Subsequently, in each of Example A8 and Example B8, to the surface of the ultra-thin copper foil, the resin solution was applied by using a reverse roll coating machine, dried in an nitrogen atmosphere, at 120° C. for 3 minutes and a 160° C. for 3 minutes, and then finally heat treated at 300° C. for 2 minutes, and thus, a copper foil provided with a resin layer was produced. The thickness of the resin layer was set to be 2 µm.

(Various Evaluations of Surface-Treated Copper Foil and Copper Foil with Carrier)

The surface-treated copper foils and the copper foils with carrier obtained as described above were subjected to various evaluations on the basis of the following methods.

<Linear Roughness Rz>

For each of the surface-treated copper foils and the copper foils with carrier of Examples and Comparative Examples, the ten-point average roughness of the surface-treated surface was measured according to JIS B0601-1994 by using the contact surface roughness meter Surfcorder SE-3C manufactured by Kosaka Laboratory Ltd. The values of three times measurements were determined by performing the measurement three times under the conditions of a measurement reference length of 0.8 mm, an evaluation length of 4 mm, a cut-off value of 0.25 mm, a feed speed of 0.1 mm/sec, while in the case of a rolled copper foil, the measurement position is being varied in the direction (TD) perpendicular to the rolling direction, or in the case of an electrolytic copper foil, the measurement position is being varied in the direction (TD) perpendicular to the traveling direction of the electrolytic copper foil in the production apparatus of the electrolytic copper foil.

<Surface Roughness Sz>

The surface roughness (the maximum height of the surface) Sz of the surface on the surface-treated layer side of each of the surface-treated copper foils and the copper foils with carrier was measured according to ISO25178, by using a laser microscope (testing apparatus: OLYMPUS LEXT OLS 4000, resolution: XY-0.12 µm, Z-0.0 µm, cut-off: none) manufactured by Olympus Corp. The measurement area of the observation section was set to be 66524 µm$^2$.

<Area Ratio (B/A)>

For each of the surface-treated copper foils and the copper foils with carrier of Examples and Comparative Examples, the area of the surface on the surface-treated layer side was measured by a measurement method based on a laser microscope. For each of the copper foils, after the surface treatment, of Examples and Comparative Examples, by using a laser microscope (testing apparatus: OLYMPUS LEXT OLS 4000, resolution: XY-0.12 µm, Z-0.0 µm, cut-off: none) manufactured by Olympus Corp., the three-dimensional area B in an area A (the surface area obtained in plan view) corresponding to 256 µm×256 µm (in the actual data, 66524 µm$^2$) was measured, and the area ratio was calculated by a technique adopting the relation, the three-dimensional area B divided by the two-dimensional area A=the area ratio (B/A). The measurement environment temperature for the three-dimensional area B with the laser microscope was set at 23 to 25° C.

For each of the surface-treated copper foils and the copper foils with carrier of Examples and Comparative Examples, a 20-cm square size of the following resin substrate was prepared, and the resin substrate were laminated and pressed to each other in such a way that the surface of the copper foil, having the surface-treated layer was brought into contact with the resin substrate. The recommended conditions of the substrate maker were adopted for the temperature, the pressure and the time in the lamination press.

Resin used: GHPL-830MBT of Mitsubishi Gas Chemical Company, Inc.

Next, the surface-treated copper foil on the resin substrate was removed by entire-surface etching under the following etching conditions. For the copper foil with carrier on the resin substrate, after peeling the carrier, the ultra-thin copper layer was removed by entire-surface etching under the following etching conditions. The "entire-surface etching" as referred to herein means an etching performed until the full thickness of the copper foil is removed, and the resin is exposed all over the surface.

(Etching conditions) Etching solutions: cupric chloride solution, HCl concentration: 3.5 mol/L, temperature: 50° C., CuCl$_2$ concentration: regulated so as to give a specific gravity of 1.26.

2. Formation of Surface Profile of Resin Substrate Using Chemical Solution

As Comparative Example B5, two 100-µm-thick sheets of the resin substrate GHPL-830MBT manufactured by Mitsubishi Gas Chemical Company, Inc. were prepared. The two sheets of the substrate were superposed on each other, and a release layer film was bonded to each side of the set of the two sheets, and the set of the two sheets was subjected to lamination pressing. The recommended conditions of the substrate maker were adopted for the temperature, the pressure and the time in the lamination press. After completion of lamination pressing, the release layer films were removed from the resin substrates, and desmear treatments A and B and a neutralization treatment were performed under the following immersion treatment conditions, to form the surface profile of the resin substrate.

(Desmear Treatment Conditions A)
Desmear treatment solution: 40 g/L KMnO$_4$, 20 g/L NaOH
Treatment temperature: Room temperature
Immersion time: 20 minutes
Number of rotations of stirrer: 300 rpm
(Desmear Treatment Conditions B)
Desmear treatment solution: 90 g/L KMnO$_4$, 5 g/L HCl
Treatment temperature: 49° C.
Immersion time: 20 minutes
Number of rotations of stirrer: 300 rpm
(Neutralization Treatment Conditions)
Neutralization treatment solution: L-Ascorbic acid 80 g/L
Treatment temperature: Room temperature
Immersion time: 3 minutes
No stirring As Comparative Example B6, two 100-μm-thick sheets of the resin substrate GHPL-830MBT manufactured by Mitsubishi Gas Chemical Company, Inc. were prepared. The two sheets of the substrate were superposed on each other, and a release layer film was bonded to each side of the set of the two sheets, and the set of the two sheets was subjected to lamination pressing. The recommended conditions of the substrate maker were adopted for the temperature, the pressure and the time in the lamination press. After completion of lamination pressing, the release layer films were removed from the resin substrates, and desmear treatments A and B and a neutralization treatment were performed under the following immersion treatment conditions, to form the surface profile of the resin substrate.

(Desmear treatment conditions A)
Desmear treatment solution: 40 g/L KMnO$_4$, 20 g/L NaOH
Treatment temperature: Room temperature
Immersion time: 20 minutes
Number of rotations of stirrer: 300 rpm
(Desmear Treatment Conditions B)
Desmear treatment solution: 90 g/L KMnO$_4$, 5 g/L HCl
Treatment temperature: 49° C.
Immersion time: 30 minutes
Number of rotations of stirrer: 300 rpm
(Neutralization Treatment Conditions)
Neutralization treatment solution: L-Ascorbic acid 80 g/L
Treatment temperature: Room temperature
Immersion time: 3 minutes
No stirring As Comparative Example B9, two 100-μm-thick sheets of the resin substrate GHPL-830MBT manufactured by Mitsubishi Gas Chemical Company, Inc. were prepared. The two sheets of the substrate were superposed on each other, and a release layer film was bonded to each side of the set of the two sheets, and the set of the two sheets was subjected to lamination pressing. The recommended conditions of the substrate maker were adopted for the temperature, the pressure and the time in the lamination press. After completion of lamination pressing, the release layer films were removed from the resin substrates, and on the surfaces of the resin substrate, shower treatments A and B and a neutralization treatment were performed under the following treatment conditions, to form the surface profile of the resin substrate.

(Shower Treatment Conditions A)
Desmear treatment solution: 40 g/L KMnO$_4$, 20 g/L NaOH
Treatment temperature: Room temperature
Treatment time: 20 minutes
Shower pressure: 0.2 MPa
(Shower Conditions B)
Desmear treatment solution: 90 g/L KMnO$_4$, 5 g/L HCl
Treatment temperature: 49° C.
Treatment time: 20 minutes
Shower pressure: 0.2 MPa
(Neutralization Conditions)
Neutralization treatment solution: L-Ascorbic acid 80 g/L
Treatment temperature: Room temperature
Immersion time: 3 minutes
No stirring Thus, the formation of the surface profiles of the resin substrates using chemical solutions was performed.

(Evaluations of Resin Substrates)

The resin substrates of Examples and Comparative Examples having the surface profiles produced above were subjected to the following evaluations.

<Linear Roughness Rz>

For each of the etched side surfaces of the resin substrates of Examples and Comparative Examples, the ten-point average roughness was measured according to JIS B0601-1994 by using the contact surface roughness meter Surfcorder SE-3C manufactured by Kosaka Laboratory Ltd. The values of three times measurements were determined by performing the measurement three times under the conditions of a measurement reference length of 0.8 mm, an evaluation length of 4 mm, a cut-off value of 0.25 mm, a feed speed of 0.1 mm/sec.

<Surface Roughness Sz>

For each of the etched side surfaces of the resin substrates of Examples and Comparative Examples, by using a laser microscope (testing apparatus: OLYMPUS LEXT OLS 4000, resolution: XY-0.12 μm, Z-0.0 μm, cut-off: none) manufactured by Olympus Corp., the surface roughness (the maximum height of the surface) Sz was measured according to ISO25178. The measurement area of the observation section was set to be 66524 μm$^2$.

<Area Ratio (B/A)>

For each of the etched side surfaces of the resin substrates of Examples and Comparative Examples, by using a laser microscope (testing apparatus: OLYMPUS LEXT OLS 4000, resolution: XY-0.12 Z-0.0 cut-off: none) manufactured by Olympus Corp., the three-dimensional area B in an area A (the surface area obtained in plan view) corresponding to 256×256 μm (in the actual data, 66524 μm$^2$) was measured, and the area ratio was calculated by a technique adopting the relation, the three-dimensional area B divided by the two-dimensional area A=the area ratio (B/A). The measurement environment temperature for the three-dimensional area B with the laser microscope was set at 23 to 25° C.

<Black Area Rate>

For each of the etched side surfaces of the resin substrates of Examples and Comparative Examples, by using a scanning electron microscope (SEM), photography was performed with an acceleration voltage set at 15 kV. During photography, contrast and brightness were regulated so as for the contours of the holes in the whole observation field to be clearly seen. Photography was performed in the state in which the contours of the holes were able to be observed, but not in the state in which the entire photograph was white or black. When photography is performed in a state in which the contours of the holes can be observed, but not in the state in which the entire photograph is white or black, the black area rates (%) of the photographs concerned give nearly the same values. A black-white image processing was applied to the taken photographs (SEM images (magnification of 30 k (30000)), by using Photo Shop 7.0 software, and thus, the black area rates (%) were determined. The black area rate (%) was determined as the rate of the black area in relation to the observation area (the sum of the white area and the black area) at the threshold value of 128 set by selecting "Histogram" of "Image" found in Photo Shop 7.0.

<Average Value of Diameters of Holes>

For each of the etched side surfaces of the resin substrates of Examples and Comparative Examples, from the SEM image (×6000 to ×30000), by the segment method, the diameters of the holes were measured longitudinally, transversely and obliquely, and the average value of N=3 of these values was calculated.

<Peel Strength>

The etched surface of each of the resin substrates (entire-surface etched substrates) was provided with a catalyst for depositing electroless copper, and was subjected to an electroless copper plating under the following conditions by using the KAP-8 bath manufactured by Kanto Kasei Co., Ltd. The thickness of the obtained electroless copper plating was 0.5 μm.

$CuSO_4$ concentration: 0.06 mol/L, HCHO concentration: 0.5 mol/L, EDTA concentration: 0.12 mol/L, pH12.5, additive: 2,2'-bipyridyl, additive concentration: 10 mg/L, surfactant: REG-1000, surfactant concentration: 500 mg/L Next, on the electroless copper plating, further electrolytic plating was performed by using the following electrolyte. The copper thickness (total thickness of electroless plating and electrolytic plating) was 12

Simple copper sulfate electrolyte: Cu concentration: 100 g/L, $H_2SO_4$ concentration: 80 g/L A 10-mm-wide copper circuit was formed by wet etching on the laminate with copper plating formed as described above by subjecting the resin substrate (entire-surface etched substrate) to electroless copper plating and electrolytic copper plating so as to have a copper layer thickness of 12 According to JIS-C-6481, the strength in the case of peeling this copper circuit at an angle of 90 degrees was measured to be taken as the peel strength.

<Fine Wiring Formability>

On the laminate with copper plating formed as described above by subjecting the resin substrate (entire-surface etched substrate) to electroless copper plating and electrolytic copper plating so as to have a copper layer thickness of 12 μm, circuits having L(line)/S(space)=15 μm/15 μm and 10 μm/10 μm, respectively, were formed by processing the plating copper by etching. In this case, the fine wirings formed on the resin substrate was visually observed, and the case where the detachment of the circuit, the shortening between the circuits (abnormal deposition of copper between circuits) and the deficit of the circuit were not found was marked as acceptable (circle).

Tables 1 and 4 show the production conditions of the above-described copper foils used to obtain the surface profiles of the substrates by transferring the profiles of the surfaces of the copper foils to the surfaces of the substrates, in Examples A1 to A11, Comparative Examples A1 to A4, Examples B1 to B12, and Comparative Examples B1 to B4.

Tables 2 and 5 show the above-described evaluation results of the surface profiles of the substrates.

Tables 3 and 6 show the above-described evaluation results of the surface profiles of the copper foils giving the surface profiles of the substrates.

TABLE 1

| Sample | Raw foil (corresponding to copper foil bulk layer) | Surface treatment | | | | |
|---|---|---|---|---|---|---|
| | | Treated side surface | Roughening treatment | Barrier treatment | Rust-preventing treatment | Application of silane coupling agent |
| Example A1 | Ultra-thin raw foil with carrier | Ultra-thin copper surface | Fine roughening (3) | Not applied | Applied | Applied |
| Example A2 | Ultra-thin raw foil with carrier | Ultra-thin copper surface | Fine roughening (4) | Not applied | Applied | Applied |
| Example A3 | Ultra-thin raw foil with carrier | Ultra-thin copper surface | Fine roughening (1) | Zn•Ni | Applied | Applied |
| Example A4 | Ultra-thin raw foil with carrier | Ultra-thin copper surface | Fine roughening (2) | Not applied | Applied | Applied |
| Example A5 | Double flat sided electrolytic raw copper foil | M surface (high gloss surface) | Fine roughening (3) | Not applied | Applied | Applied |
| Example A6 | Double flat sided electrolytic raw copper foil | M surface (high gloss surface) | Fine roughening (1) | Brass | Applied | Applied |
| Example A7 | Common electrolytic raw foil | S surface | Not applied | Not applied | Applied | Applied |
| Example A8 | Ultra-thin raw foil with carrier (with resin) | Ultra-thin copper surface | Fine roughening (4) | Not applied | Applied | Applied |
| Example A9 | Ultra-thin raw foil with carrier | Ultra-thin copper surface | Fine roughening (5) | Not applied | Applied | Applied |
| Example A10 | Ultra-thin raw foil with carrier | Ultra-thin copper surface | Fine roughening (6) | Not applied | Applied | Applied |
| Example A11 | Ultra-thin raw foil with carrier | Ultra-thin copper surface | Fine roughening (7) | Not applied | Applied | Applied |
| Comparative Example A1 | Common electrolytic raw foil | M surface | Fine roughening (1) | Zn•Ni | Applied | Applied |

TABLE 1-continued

| | | Surface treatment | | | | |
|---|---|---|---|---|---|---|
| Sample | Raw foil (corresponding to copper foil bulk layer) | Treated side surface | Roughening treatment | Barrier treatment | Rust-preventing treatment | Application of silane coupling agent |
| Comparative Example A2 | Common electrolytic raw foil | M surface | Spherical roughening (ordinary) | Brass | Applied | Applied |
| Comparative Example A3 | Common electrolytic raw foil | S surface | Spherical roughening (ordinary) | Brass | Applied | Applied |
| Comparative Example A4 | Ultra-thin raw foil with carrier | Ultra-thin copper surface | Not applied | Not applied | Applied | Applied |

TABLE 2

| | Thickness of copper foil (μm) | Contact surface roughness meter Linear roughness Rz (μm) | Laser roughness meter | | | | | | | Fine wiring formability | |
|---|---|---|---|---|---|---|---|---|---|---|---|---|
| | | | Surface roughness Sz (μm) | Observation section surface area A (μm2) | Measured surface area B (μm2) | Surface area ratio B/A | Black area rate (%) | Average value of diameters of holes (μm) | Peel strength (kg/cm) | Evaluation | L/S = 15/15 | L/S = 10/10 |
| Example A1 | 3 | 0.8 | 1.65 | 66524 | 67490 | 1.0145 | 19 | 0.09 | 0.64 | ○ | ○ | ○ |
| Example A2 | 3 | 1.1 | 2.24 | 66524 | 74186 | 1.1152 | 28 | 0.39 | 0.72 | ○ | ○ | ○ |
| Example A3 | 3 | 1.1 | 2.65 | 66524 | 78503 | 1.1801 | 38 | 0.18 | 0.78 | ○ | ○ | ○ |
| Example A4 | 3 | 1.6 | 3.39 | 66524 | 83369 | 1.2532 | 50 | 0.76 | 0.53 | ○ | ○ | X |
| Example A5 | 12 | 1.2 | 1.83 | 66524 | 68101 | 1.0237 | 31 | 0.11 | 0.68 | ○ | ○ | ○ |
| Example A6 | 12 | 1.0 | 2.95 | 66524 | 85124 | 1.2796 | 34 | 0.56 | 0.80 | ○ | ○ | ○ |
| Example A7 | 12 | 1.6 | 2.05 | 66524 | 68258 | 1.0261 | 25 | 0.03 | 0.50 | ○ | ○ | ○ |
| Example A8 | 3 (with resin) | 1.1 | 2.32 | 66524 | 73698 | 1.1078 | 27 | 0.38 | 0.95 | ○ | ○ | ○ |
| Example A9 | 1.5 | 0.8 | 0.97 | 66524 | 71846 | 1.0800 | 9 | 0.20 | 0.52 | ○ | ○ | ○ |
| Example A10 | 2 | 1.6 | 5.12 | 66524 | 100518 | 1.5110 | 49 | 0.89 | 0.81 | ○ | ○ | X |
| Example A11 | 5 | 0.8 | 1.05 | 66524 | 67123 | 1.0090 | 9 | 0.35 | 0.52 | ○ | ○ | ○ |
| Comparative Example A1 | 12 | 2.5 | 7.03 | 66524 | 117312 | 1.7635 | 54 | 3.40 | 0.83 | ○ | X | X |
| Comparative Example A2 | 12 | 2.4 | 8.53 | 66524 | 128211 | 1.9273 | 62 | 2.13 | 0.80 | ○ | X | X |
| Comparative Example A3 | 12 | 1.6 | 5.25 | 66524 | 101589 | 1.5271 | 58 | 1.82 | 0.40 | X | ○ | ○ |
| Comparative Example A4 | 3 | 0.3 | 0.78 | 66524 | 66590 | 1.0010 | 0 | 0.00 | 0.25 | X | ○ | ○ |

TABLE 3

| | Thickness of copper foil (μm) | Contact surface roughness meter Linear roughness Rz (μm) | Laser roughness meter | | | |
|---|---|---|---|---|---|---|
| | | | Surface roughness Sz (μm) | Observation section surface area A (μm2) | Measured surface area B (μm2) | Surface area ratio B/A |
| Example A1 | 3 | 0.8 | 2.51 | 66524 | 77819 | 1.1698 |
| Example A2 | 3 | 1.0 | 3.23 | 66524 | 79589 | 1.1964 |
| Example A3 | 3 | 1.0 | 3.59 | 66524 | 82498 | 1.2401 |
| Example A4 | 3 | 1.6 | 3.40 | 66524 | 87160 | 1.3102 |
| Example A5 | 12 | 0.6 | 2.28 | 66524 | 75913 | 1.1411 |
| Example A6 | 12 | 1.5 | 4.82 | 66524 | 110975 | 1.6682 |
| Example A7 | 12 | 1.6 | 2.76 | 66524 | 72121 | 1.0841 |
| Example A8 | 3 (with resin) | 1.0 | 3.18 | 66524 | 78966 | 1.1870 |
| Example A9 | 1.5 | 0.7 | 1.92 | 66524 | 74706 | 1.1230 |
| Example A10 | 2 | 1.7 | 6.72 | 66524 | 107769 | 1.6200 |
| Example A11 | 5 | 0.7 | 2.80 | 66524 | 68613 | 1.0314 |

TABLE 3-continued

|  | Thickness of copper foil (μm) | Contact surface roughness meter Linear roughness Rz (μm) | Surface roughness Sz (μm) | Laser roughness meter Observation section surface area A (μm2) | Measured surface area B (μm2) | Surface area ratio B/A |
|---|---|---|---|---|---|---|
| Comparative Example A1 | 12 | 2.5 | 7.95 | 66524 | 144589 | 2.1735 |
| Comparative Example A2 | 12 | 3.6 | 9.79 | 66524 | 157818 | 2.3723 |
| Comparative Example A3 | 12 | 2.0 | 6.24 | 66524 | 134521 | 2.0221 |
| Comparative Example A4 | 3 | 0.8 | 1.20 | 66524 | 66925 | 1.0060 |

TABLE 4

| Sample | Raw foil (corresponding to copper foil bulk layer) | Surface treatment Treated side surface | Roughening treatment | Barrier treatment | Rust-preventing treatment | Application of silane coupling agent |
|---|---|---|---|---|---|---|
| Example B1 | Ultra-thin raw foil with carrier | Ultra-thin copper surface | Fine roughening (3) | Not applied | Applied | Applied |
| Example B2 | Ultra-thin raw foil with carrier | Ultra-thin copper surface | Fine roughening (4) | Not applied | Applied | Applied |
| Example B3 | Ultra-thin raw foil with carrier | Ultra-thin copper surface | Fine roughening (1) | Zn•Ni | Applied | Applied |
| Example B4 | Ultra-thin raw foil with carrier | Ultra-thin copper surface | Fine roughening (2) | Not applied | Applied | Applied |
| Example B5 | Double flat sided electrolytic raw copper foil | M surface (high gloss surface) | Fine roughening (3) | Not applied | Applied | Applied |
| Example B6 | Double flat sided electrolytic raw copper foil | M surface (high gloss surface) | Fine roughening (1) | Brass | Applied | Applied |
| Example B7 | Common electrolytic raw foil | S surface | Not applied | Not applied | Applied | Applied |
| Example B8 | Ultra-thin raw foil with carrier (with resin) | Ultra-thin copper surface | Fine roughening (4) | Not applied | Applied | Applied |
| Example B10 | Ultra-thin raw foil with carrier | Ultra-thin copper surface | Fine roughening (5) | Not applied | Applied | Applied |
| Example B11 | Ultra-thin raw foil with carrier | Ultra-thin copper surface | Fine roughening (6) | Not applied | Applied | Applied |
| Example B12 | Ultra-thin raw foil with carrier | Ultra-thin copper surface | Fine roughening (7) | Not applied | Applied | Applied |
| Comparative Example B1 | Common electrolytic raw foil | M surface | Fine roughening (1) | Zn•Ni | Applied | Applied |
| Comparative Example B2 | Common electrolytic raw foil | M surface | Spherical roughening (ordinary) | Brass | Applied | Applied |
| Comparative Example B3 | Common electrolytic raw foil | S surface | Spherical roughening (ordinary) | Brass | Applied | Applied |
| Comparative Example B4 | Ultra-thin raw foil with carrier | Ultra-thin copper surface | Not applied | Not applied | Not applied | Applied |

TABLE 5

| | Thickness of copper foil (μm) | Contact surface roughness meter Linear roughness Rz (μm) | Laser roughness meter Surface roughness Sz (μm) | Observation section surface area A (μm²) | Measured surface area B (μm²) | Surface area ratio B/A | Black area rate (%) | Average value of diameters of holes (μm) | Peel strength (kg/cm) | Fine wiring formability Evaluation | L/S = 15/15 | L/S = 10/10 |
|---|---|---|---|---|---|---|---|---|---|---|---|---|
| Example B1 | 3 | 0.8 | 1.65 | 66524 | 67490 | 1.0145 | 19 | 0.09 | 0.64 | ○ | ○ | ○ |
| Example B2 | 3 | 1.1 | 2.24 | 66524 | 74186 | 1.1152 | 28 | 0.39 | 0.72 | ○ | ○ | ○ |
| Example B3 | 3 | 1.1 | 2.65 | 66524 | 78503 | 1.1801 | 38 | 0.18 | 0.78 | ○ | ○ | ○ |
| Example B4 | 3 | 1.6 | 3.39 | 66524 | 83369 | 1.2532 | 50 | 0.76 | 0.53 | ○ | ○ | X |
| Example B5 | 12 | 1.2 | 1.83 | 66524 | 68101 | 1.0237 | 31 | 0.11 | 0.68 | ○ | ○ | ○ |
| Example B6 | 12 | 1.0 | 2.95 | 66524 | 85124 | 1.2796 | 34 | 0.56 | 0.80 | ○ | ○ | ○ |
| Example B7 | 12 | 1.6 | 2.05 | 66524 | 68258 | 1.0261 | 25 | 0.03 | 0.50 | ○ | ○ | ○ |
| Example B8 | 3 (with resin) | 1.1 | 2.32 | 66524 | 73698 | 1.1078 | 27 | 0.38 | 0.95 | ○ | ○ | ○ |
| Example B9 | (No use of copper foil) | 0.8 | 1.56 | 66524 | 67825 | 1.0196 | 20 | 0.07 | 0.58 | ○ | ○ | ○ |
| Example B10 | 1.5 | 0.8 | 0.97 | 66524 | 71846 | 1.0800 | 9 | 0.20 | 0.52 | ○ | ○ | ○ |
| Example B11 | 2 | 1.6 | 5.12 | 66524 | 100518 | 1.5110 | 49 | 0.89 | 0.81 | ○ | ○ | X |
| Example B12 | 5 | 0.8 | 1.05 | 66524 | 67123 | 1.0090 | 9 | 0.35 | 0.52 | ○ | ○ | ○ |
| Comparative Example B1 | 12 | 2.5 | 7.03 | 66524 | 117312 | 1.7635 | 54 | 3.40 | 0.83 | ○ | X | X |
| Comparative Example B2 | 12 | 2.4 | 8.53 | 66524 | 128211 | 1.9273 | 62 | 2.13 | 0.80 | ○ | X | X |
| Comparative Example B3 | 12 | 1.6 | 5.25 | 66524 | 101589 | 1.5271 | 58 | 1.82 | 0.40 | X | ○ | ○ |
| Comparative Example B4 | 3 | 0.3 | 0.78 | 66524 | 66590 | 1.0010 | 0 | 0.00 | 0.25 | X | ○ | ○ |
| Comparative Example B5 | (No use of copper foil) | 0.8 | 0.96 | 66524 | 66829 | 1.0046 | 8 | 0.005 | 0.42 | X | ○ | ○ |
| Comparative Example B6 | (No use of copper foil) | 0.8 | 0.91 | 66524 | 66721 | 1.0030 | 10 | 0.003 | 0.40 | X | ○ | ○ |

TABLE 6

| | Thickness of copper foil (μm) | Contact surface roughness meter Linear roughness Rz (μm) | Laser roughness meter Surface roughness Sz (μm) | Observation section surface area A (μm²) | Measured surface area B (μm²) | Surface area ratio B/A |
|---|---|---|---|---|---|---|
| Example B1 | 3 | 0.8 | 2.51 | 66524 | 77819 | 1.1698 |
| Example B2 | 3 | 1.0 | 3.23 | 66524 | 79589 | 1.1964 |
| Example B3 | 3 | 1.0 | 3.59 | 66524 | 82498 | 1.2401 |
| Example B4 | 3 | 1.6 | 3.40 | 66524 | 87160 | 1.3102 |
| Example B5 | 12 | 0.6 | 2.28 | 66524 | 75913 | 1.1411 |
| Example B6 | 12 | 1.5 | 4.82 | 66524 | 110975 | 1.6682 |
| Example B7 | 12 | 1.6 | 2.76 | 66524 | 72121 | 1.0841 |
| Example B8 | 3 (with resin) | 1.0 | 3.18 | 66524 | 78966 | 1.1870 |
| Example B10 | 1.5 | 0.7 | 1.92 | 66524 | 74706 | 1.1230 |
| Example B11 | 2 | 1.7 | 6.72 | 66524 | 107769 | 1.6200 |
| Example B12 | 5 | 0.7 | 2.24 | 66524 | 68613 | 1.0314 |
| Comparative Example B1 | 12 | 2.5 | 7.95 | 66524 | 144589 | 2.1735 |
| Comparative Example B2 | 12 | 3.6 | 9.79 | 66524 | 157818 | 2.3723 |
| Comparative Example B3 | 12 | 2.0 | 6.24 | 66524 | 134521 | 2.0221 |
| Comparative Example B4 | 3 | 0.8 | 1.20 | 66524 | 66925 | 1.0060 |

Note:
The data of the roughness and the surface area ratio of the copper foil of Example B8 are the data of the copper foil before application of the resin.

(Evaluation Results)

Each of Examples A1 to A11 had a satisfactory fine wiring formability, and moreover, exhibited a satisfactory peel strength.

Each of the copper foils of Comparative Examples A1 to A4 had the surface roughness Sz of the surface of the surface-treated layer falling outside the range from 2 to 6 μm, and accordingly had the surface roughness Sz in the surface profile of the substrate falling outside the range from 1 to 5 μm to result in a poor fine wiring formability or a poor peel strength. Each of the copper foils of Comparative Examples A1 to A4 had the ratio B/A of the three-dimensional surface area B to the two-dimensional surface area A of the surface of the surface-treated layer falling outside the range from 1.05 to 1.8, and accordingly the ratio B/A concerned in the surface profile of the substrate fell outside the range from 1.01 to 1.5 to result in a poor fine wiring formability or a poor peel strength. Each of the surface profiles of the substrates of Comparative Examples A1 to A4 had a black area rate of the surface falling outside the range from 10 to 50%, and an average value of the diameters of the holes of the surface falling outside the range from 0.03 to 1.0 μm, to result in a poor fine wiring formability or a poor peel strength.

From the evaluation results of Examples and Comparative Examples, it has been verified that the numerical values of Rz of the surface of the copper foil and the surface of the substrate are not particularly related to the combination of a satisfactory fine wiring formability and a satisfactory peel strength.

Each of the substrates of Examples B1 to B12 had a satisfactory fine wiring formability, and moreover exhibited a satisfactory peel strength.

Each of the substrates of Comparative Examples B1 to B6 had a surface roughness Sz of the surface falling outside the range from 1 to 5 μm, to result in a poor fine wiring formability or a poor peel strength. Each of the substrates of Comparative Examples B1 to B4 had the ratio B/A of the three-dimensional surface area B to the two-dimensional surface area A of the surface ratio B/A of the three-dimensional surface area B to the two-dimensional surface area A of the surface falling outside the range from 1.01 to 1.5, to result in a poor fine wiring formability or a poor peel strength. Each of the substrates of Comparative Examples B1 to B6 had both or either of a black area rate of the surface falling outside the range from 10 to 50% and the average value of the diameters of the holes of the surface falling outside the range from 0.03 to 1.0 μm, to result in a poor fine wiring formability or a poor peel strength.

From the evaluation results of Examples and Comparative Examples, it has been verified that the numerical value of Rz of the surface of the substrate is not particularly related to the combination of a satisfactory fine wiring formability and a satisfactory peel strength.

Figure 3:
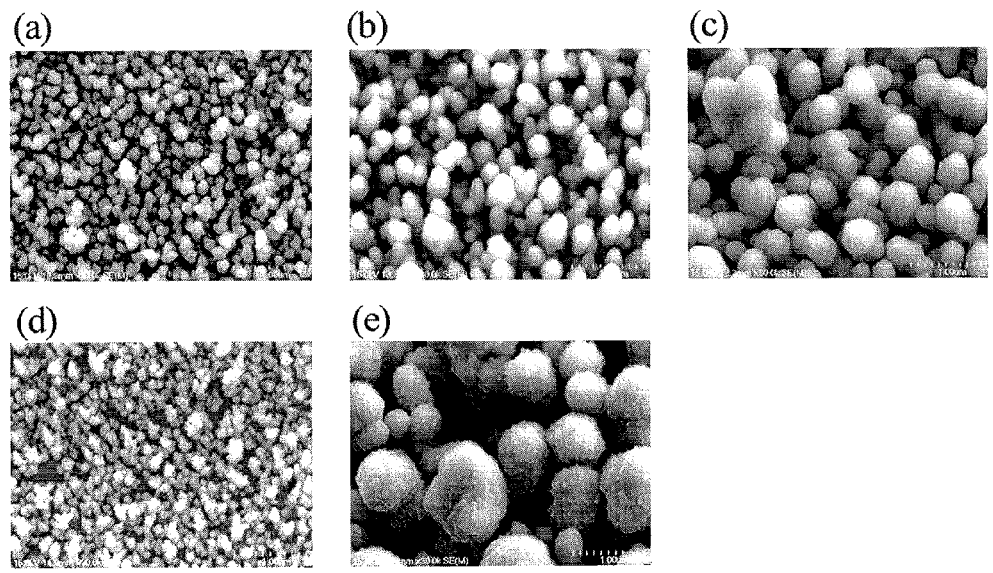
FIGS. 3 (a), 3 (b), 3(c), 3(d) and 3 (e) show the SEM images (×30000) of the copper foil-treated surfaces of Examples A1, A2, A3, A5 and A6, respectively.

FIGS. 3 (a), 3 (b), 3 (c), 3 (d) and 3 (e) show the SEM images (×30000) of the copper foil-treated surfaces of Examples A1, A2, A3, A5 and A6, respectively.

Figure 4:
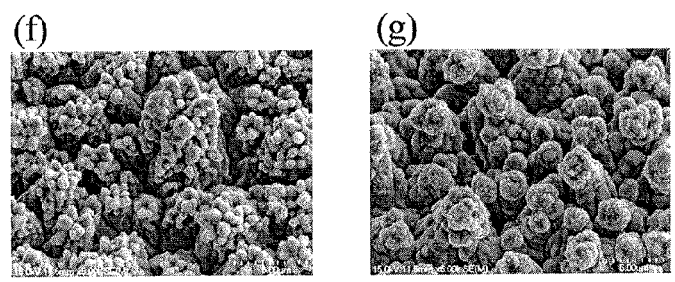
FIGS. 4(f) and 4(g) show the SEM images (×6000) of the copper foil-treated surfaces of Comparative Examples A1 and A2.
Figure 5:
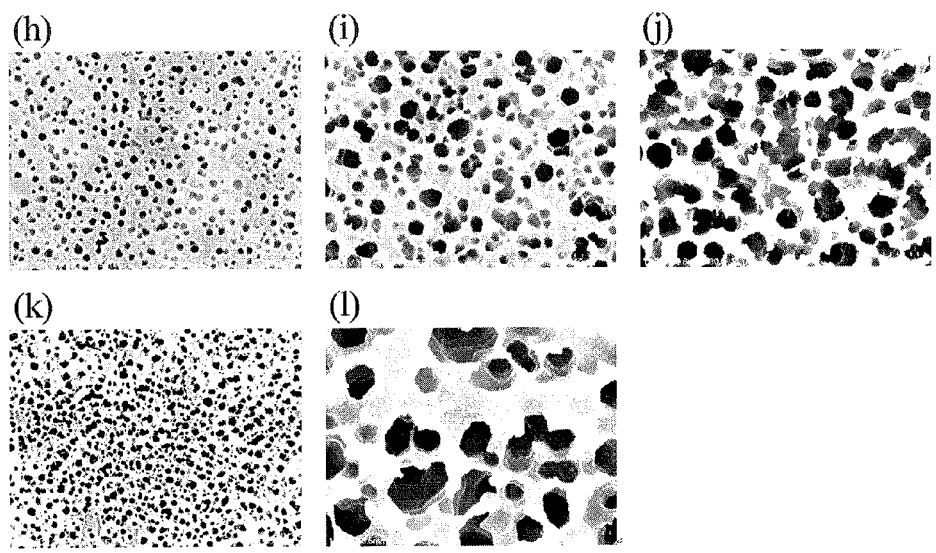
FIGS. 5(h), 5(i), 5(j), 5(k) and 5(l) show the SEM images (×30000) of the surfaces of the resin substrates of Examples A1(B1), A2(B2), A3(B3), A5(B5) and A6(B6), respectively.

FIGS. 4(f) and 4(g) show the SEM images (×6000) of the copper foil-treated surfaces of Comparative Examples A1 and A2.

FIGS. 5(h), 5(i), 5(j), 5(k) and 5(l) show the SEM images (×30000) of the surfaces of the resin substrates of Examples A1(B1), A2(B2), A3(B3), A5(B5) and A6(B6), respectively.

Figure 6:
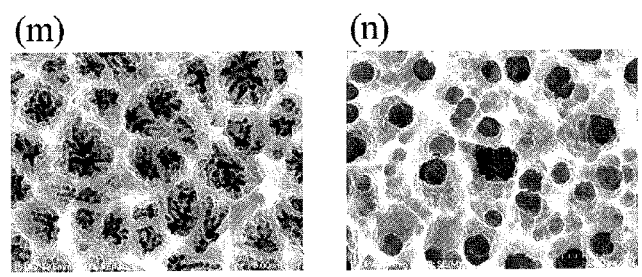
FIGS. 6(m) and 6(n) show the SEM images (×6000) of the surfaces of the resin substrates of Comparative Examples A1(B1) and A2(B2), respectively.

FIGS. 6(m) and 6(n) show the SEM images (×6000) of the surfaces of the resin substrates of Comparative Examples A1(B1) and A2(B2), respectively.

The invention claimed is:

1. A surface-treated copper foil, wherein a surface treated layer is formed on a copper foil, wherein the surface roughness Sz of the surface of the surface-treated layer is 2 to 6 μm.

2. The surface-treated copper foil according to claim 1, wherein at least one of the following (1) to (4) is satisfied:

(1) the surface-treated layer is a roughening-treated layer,
(2) the surface-treated layer is a roughening-treated layer, and the surface-treated copper foil has, on the surface of the roughening-treated layer, one or more layers selected from the group consisting of a heat resistant layer, a rust-preventing layer, a chromate-treated layer and a silane coupling treated layer,
(3) the surface-treated layer is one or more layers selected from the group consisting of a roughening-treated layer, a heat resistant layer, a rust-preventing layer, a chromate-treated layer and a silane coupling treated layer, or
(4) the surface-treated layer is provided with a resin layer on the surface-treated layer.

3. A copper foil with carrier, comprising on one side or both sides of the carrier, an intermediate layer and an ultra-thin copper layer in this order, wherein the ultra-thin copper layer is the surface-treated copper foil according to claim 1, and optionally the surface-treated copper foil comprises a resin layer on the surface treated layer.

4. The surface-treated copper foil according to claim 1, wherein at least one of the following (1) or (2) is satisfied:

(1) the surface roughness Sz of the surface of the surface-treated layer is 2 to 3.23 μm,
(2) the ratio B/A of the three-dimensional surface area B to the two-dimensional surface area A of the surface of the surface-treated layer is 1.01 to 1.2401.

5. The surface-treated copper foil according to claim 1, wherein the ratio B/A of the three-dimensional surface area B to the two-dimensional surface area A of the surface of the surface-treated layer is 1.05 to 1.8.

6. A method for producing a copper clad laminate comprising:

a step of preparing the surface-treated copper foil according to claim 1, or a copper foil with carrier comprising a carrier, an intermediate layer and an ultra-thin copper layer in this order, the ultra-thin copper layer being the surface-treated copper foil of claim 1, and
a step of laminating the surface-treated copper foil or the copper foil with carrier on an insulating substrate.

7. A method for producing a printed wiring board comprising:

a step of preparing the surface-treated copper foil according to claim 1, or a copper foil with carrier comprising a carrier, an intermediate layer and an ultra-thin copper layer in this order, the ultra-thin copper layer being the surface-treated copper foil of claim 1, and
a step of producing a printed wiring board with the surface-treated copper foil or the copper foil with carrier.

8. A method for producing an electronic device comprising:

a step of producing the printed wiring board by the method according to claim 7, and
a step of producing an electronic device with the printed wiring board.

9. A method for producing a printed wiring board, comprising:

a step of preparing the following (a) or (b), and (c) or (d),
(a) the surface-treated copper foil according to claim 1, the surface-treated copper foil optionally having a resin layer on the surface-treated layer thereof,
(b) a copper foil with carrier comprising a carrier, an intermediate layer, an ultra-thin copper layer and optionally a resin layer in this order, the ultra-thin copper layer being the surface-treated copper foil of claim 1, (c) an insulating substrate,
(d) a resin layer formed with a metal foil or a copper foil with carrier;
a step of laminating the surface-treated copper foil, via the surface-treated layer side thereof, on the insulating substrate or the resin layer, or a step of laminating the copper foil with carrier, via the ultra-thin copper layer side thereof, on the insulating substrate or the resin layer, and then, peeling the carrier of the copper foil with carrier;
a step of removing the surface-treated copper foil on the insulating substrate or the resin layer, or a step of removing the ultra-thin copper layer on the insulating substrate or the resin layer after the peeling of the carrier; and
a step of forming a circuit on the surface of the insulating substrate or the resin layer with the surface-treated copper foil or the ultra-thin copper layer removed therefrom.

10. A method for producing a printed wiring board, comprising:
a step of preparing the following (e) or (f), and (g) or (h),
(e) the surface-treated copper foil according to claim 1,
(f) a copper foil with carrier comprising a carrier, an intermediate layer and an ultra-thin copper layer in this order, the ultra-thin copper layer being the surface-treated copper foil of claim 1,
(g) an insulating substrate,
(h) a resin layer formed with a metal foil or a copper foil with carrier;
a step of forming a copper clad laminate by laminating the surface-treated copper foil, via the surface-treated layer side thereof, on the insulating substrate or on the resin layer, or by laminating the copper foil with carrier, via the ultra-thin copper layer side thereof, on the insulating substrate or on the resin layer, and then, peeling the carrier of the copper foil with carrier; and
a step of subsequently forming a circuit by a semi-additive method, a subtractive method, a partly additive method or a modified semi-additive method.

11. A method for producing a printed wiring board, comprising:
a step of preparing the surface-treated copper foil according to claim 1, with a circuit formed on the surface-treated layer formed side, or a copper foil with carrier comprising a carrier, an intermediate layer and an ultra-thin copper layer in this order, the ultra-thin copper layer being the surface-treated copper foil of claim 1, with a circuit formed on the surface thereof on the ultra-thin copper layer side;
a step of forming a resin layer on the surface of the surface-treated copper foil or the surface of the copper foil with carrier so as for the circuit to be embedded;
a step of forming a circuit on the surface of the resin layer; and
a step of exposing the circuit embedded in the resin layer by removing the surface-treated copper foil or the copper foil with carrier.

* * * * *